US012745503B2

(12) United States Patent
Kim et al.

(10) Patent No.: US 12,745,503 B2
(45) Date of Patent: Sep. 22, 2026

(54) DISPLAY DEVICE AND REPAIRING METHOD IN THE DEVICE

(71) Applicant: LG Display Co., Ltd., Seoul (KR)

(72) Inventors: Moonsoo Kim, Seoul (KR); Sunwook Ko, Seoul (KR)

(73) Assignee: LG Display Co., Ltd., Seoul (KR)

( * ) Notice: Subject to any disclaimer, the term of this patent is extended or adjusted under 35 U.S.C. 154(b) by 694 days.

(21) Appl. No.: 18/198,995

(22) Filed: May 18, 2023

(65) Prior Publication Data

US 2024/0222579 A1 Jul. 4, 2024

(30) Foreign Application Priority Data

Dec. 30, 2022 (KR) ........................ 10-2022-0191256

(51) Int. Cl.

| | |
|---|---|
| ***H10H 29/49*** | (2025.01) |
| ***G09G 3/00*** | (2006.01) |
| ***H10H 20/856*** | (2025.01) |
| ***H10H 20/857*** | (2025.01) |
| ***H10H 29/14*** | (2025.01) |
| ***H10H 29/32*** | (2025.01) |

(52) U.S. Cl.

CPC ............. *H10H 29/49* (2025.01); *G09G 3/006* (2013.01); *H10H 20/856* (2025.01); *H10H 20/857* (2025.01); *H10H 29/142* (2025.01); *H10H 29/32* (2025.01)

(58) Field of Classification Search

CPC ...... H10H 29/49; H10H 29/32; H10H 20/857; H10H 29/142; H10H 20/856; H01L 25/0753; H01L 25/167

See application file for complete search history.

(56) References Cited

U.S. PATENT DOCUMENTS

| | | | | |
|---|---|---|---|---|
| 8,884,318 | B2 | 11/2014 | Lee et al. | |
| 2005/0140903 | A1* | 6/2005 | Park | G02F 1/136286 349/141 |
| 2011/0210352 | A1 | 9/2011 | Lee et al. | |
| 2018/0175268 | A1* | 6/2018 | Moon | H10H 20/857 |

FOREIGN PATENT DOCUMENTS

| | | | |
|---|---|---|---|
| KR | 10-1665932 | B1 | 9/2011 |
| KR | 10-2017-0049117 | A | 5/2017 |

* cited by examiner

*Primary Examiner* — Peter M Albrecht

(74) *Attorney, Agent, or Firm* — Fenwick & West LLP

(57) ABSTRACT

A display device and a repairing method in the method are disclosed. The display device includes a substrate; a plurality of sub-pixels formed on the substrate; and a data line and a common voltage line disposed on each sub-pixel. Each of the plurality of sub-pixels includes a thin-film transistor; a first and second light-emitting elements that are adjacent to each other and spaced from each other; a first electrode connecting the first light-emitting element and the second light-emitting element to the common voltage line; and a second electrode connecting the first light-emitting element and the second light-emitting element to a drain electrode of the thin-film transistor, wherein the drain electrode is connected to the data line.

25 Claims, 19 Drawing Sheets

FIG. 14

DISPLAY DEVICE AND REPAIRING METHOD IN THE DEVICE

CROSS-REFERENCE TO RELATED APPLICATION

This application claims priority from Republic of Korea Patent Application No. 10-2022-0191256 filed on Dec. 30, 2022 in the Korean Intellectual Property Office, and all the benefits accruing therefrom under 35 U.S.C. 119, the contents of which are herein incorporated by reference in their entirety.

BACKGROUND

Technical Field

The present disclosure relates to a display device including a light-emitting element and a repairing method in the device.

Description of Related Art

A display device is applied to various electronic devices such as TVs, mobile phones, laptops and tablets. To this end, research to develop thinning, lightening, and low power consumption of the display device is continuing.

Among the display devices, a light-emitting display device has a light-emitting element or a light source built into the display device. Information is displayed using light from the self-light-emitting element or built-in light source. The display device with the self-light-emitting element may be implemented so as to be smaller than a display device with a built-in light source, and thus may be able to implement a display device that is flexible and foldable.

The display device having the self-light-emitting element may include, for example, an organic light-emitting display device (OLED) including a light-emitting layer made of an organic material, or a micro-LED display device (micro light-emitting diode display device), etc. In this regard, the organic light-emitting display device including the light-emitting layer made of the organic material does not require a separate light source. However, due to characteristics of the organic material that the organic material is vulnerable to moisture and oxygen, defect pixels are easily generated therein under an external environment. In contrast thereto, the micro-LED display device includes the light-emitting layer made of an inorganic material that is resistant to moisture and oxygen and thus, is not affected under the external environment and thus has high reliability and high image quality.

Further, as the micro-LED display device is resistant to the external environment, it does not require a protective structure such as a sealing member. Various types of materials may be used as a material of a substrate of the micro-LED display device. Thus, the micro-LED display device has a smaller structure than the organic light-emitting display device, and more advantageously implements a flexible display device. Thus, the micro-LED display device is in the limelight as a next-generation display device.

However, in the micro-LED display device, a procedure to form a micro-LED using a separate substrate and transfer the micro-LED to a display device is required. In this case, a defect may occur in the micro-LED itself or a defect may occur in the transfer process, such that light emission is not performed reliably.

Therefore, research on a scheme of transferring the micro-LED to a correct position of the display device and a scheme of minimizing occurrence of a dark spot due to the defect that may occur in the process of transferring the micro-LED is being conducted.

SUMMARY

A purpose according to an embodiment of the present disclosure is to provide a display device capable of selectively excluding a defective micro-LED of a sub-pixel in which the defective micro-LED occurs when the defective micro-LED occurs after transferring a plurality of micro-LEDs.

Further, a purpose according to an embodiment of the present disclosure is to introduce a reflective layer having a bottom portion disposed on the substrate and extending horizontally and a sidewall portion upwardly extending from the bottom portion and extending through the interlayer insulating film in an inclined manner, thereby allowing at least two micro-LEDs to be transferred to an accurate position.

Further, a purpose according to an embodiment of the present disclosure is to provide a display device capable of easily electrically disconnecting a defective micro-LED from a sub-pixel in which the defective micro-LED is generated.

In addition, a purpose according to an embodiment of the present disclosure is to provide a repairing method in a display device capable of repairing a defective sub-pixel having a defective micro-LED to a normal sub-pixel without removing the defective micro-LED from the substrate.

In addition, a purpose according to an embodiment of the present disclosure is to minimize occurrence of dark spots due to defects using the repairing method.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A first embodiment of the present disclosure provides a display device comprising: a substrate; a plurality of sub-pixels formed on the substrate; a thin-film transistor included in each of the plurality of sub-pixels; a data line and a common voltage line disposed on each sub-pixel; first and second light-emitting elements included in each sub-pixel, wherein the second light-emitting element and the first light-emitting element are adjacent to each other and spaced from each other; a first electrode connecting the first light-emitting element and the second light-emitting element included in each sub-pixel to the common voltage line; and a second electrode connecting the first light-emitting element and the second light-emitting element included in each sub-pixel to a drain electrode of the thin-film transistor, wherein the drain electrode is connected to the data line.

A second embodiment of the present disclosure provides a display device comprising: a substrate; a thin-film transistor disposed on the substrate; an interlayer insulating film disposed on the thin-film transistor; a reflective layer extending through the interlayer insulating film; a first insulating layer disposed on the reflective layer; a first light-emitting element disposed on the first insulating layer and in an area overlapping the reflective layer, wherein the first light-emitting element includes a first pad electrode and a second pad electrode; a second light-emitting element adjacent to and spaced from the first light-emitting element, and disposed on the first insulating layer and in the area overlapping the reflective layer, wherein the second light-emitting element includes a first pad electrode and a second pad electrode; a first electrode connected to each of the first pad electrode of the first light-emitting element and the first pad electrode of the second light-emitting element, wherein the first electrode extends through the first insulating layer so as to be connected to a common voltage line; and a second electrode connected to each of the second pad electrode of the first light-emitting element and the second pad electrode of the second light-emitting element, wherein the second electrode extends through the first insulating layer so as to be connected to the thin-film transistor.

A third embodiment of the present disclosure provides a repairing method in a display device, wherein the display device includes: a substrate; a plurality of sub-pixels formed on the substrate; a thin-film transistor included in each of the plurality of sub-pixels; a data line and a common voltage line disposed on each sub-pixel; first and second light-emitting elements included in each sub-pixel, wherein the second light-emitting element and the first light-emitting element are adjacent to each other and spaced from each other; a first electrode connecting the first light-emitting element and the second light-emitting element included in each sub-pixel to the common voltage line; and a second electrode connecting the first light-emitting element and the second light-emitting element included in each sub-pixel to a drain electrode of the thin-film transistor, wherein the drain electrode is connected to the data line, wherein the repairing method comprises: when one of the first light-emitting element and the second light-emitting element included in each sub-pixel is defective, supplying a current having a current amount capable of generating Joule-heat to the second electrode supplying the current to the one as a defective light-emitting element so as to break a portion of the second electrode connected to the one, such that the other of the first light-emitting element and the second light-emitting element acts as a normal light-emitting element and are electrically connected to the data line via an non-broken portion of the second electrode.

According to an embodiment of the present disclosure, the plurality of micro-LEDs are disposed in one sub-pixel to minimize occurrence of dark spots due to defects.

Even when a defective micro-LED occurs after transferring a plurality of micro-LEDs, only the defective micro-LED may be selectively electrically disconnected from a corresponding sub-pixel having the defective micro-LED, such that the corresponding sub-pixel can operate as a normal sub-pixel. Accordingly, a process yield may be improved.

Further, the plurality of micro-LEDs may be disposed in one sub-pixel, and the reflective layer having the bottom portion disposed on the substrate and extending horizontally and a sidewall portion upwardly extending from the bottom portion and extending through the interlayer insulating film in an inclined manner may be introduced, thereby allowing at least two micro-LEDs to be transferred to an accurate position. Further, light-emitting efficiency may be improved.

In addition, the micro-LED is disposed on a portion of the second insulating layer whose a bottom surface is positioned at a first vertical level lower than a second vertical level of the upper surface of the interlayer insulating film, thereby reducing a thickness of the display device.

Effects of the present disclosure are not limited to the effects mentioned above, and other effects not mentioned will be clearly understood by those skilled in the art from the descriptions below.

BRIEF DESCRIPTION OF DRAWINGS

FIG. 14 and FIG. 15 are diagrams for illustrating light-emitting efficiency of the display device according to each of the first embodiment and the second embodiment of the present disclosure.

DETAILED DESCRIPTION

Figure 1:
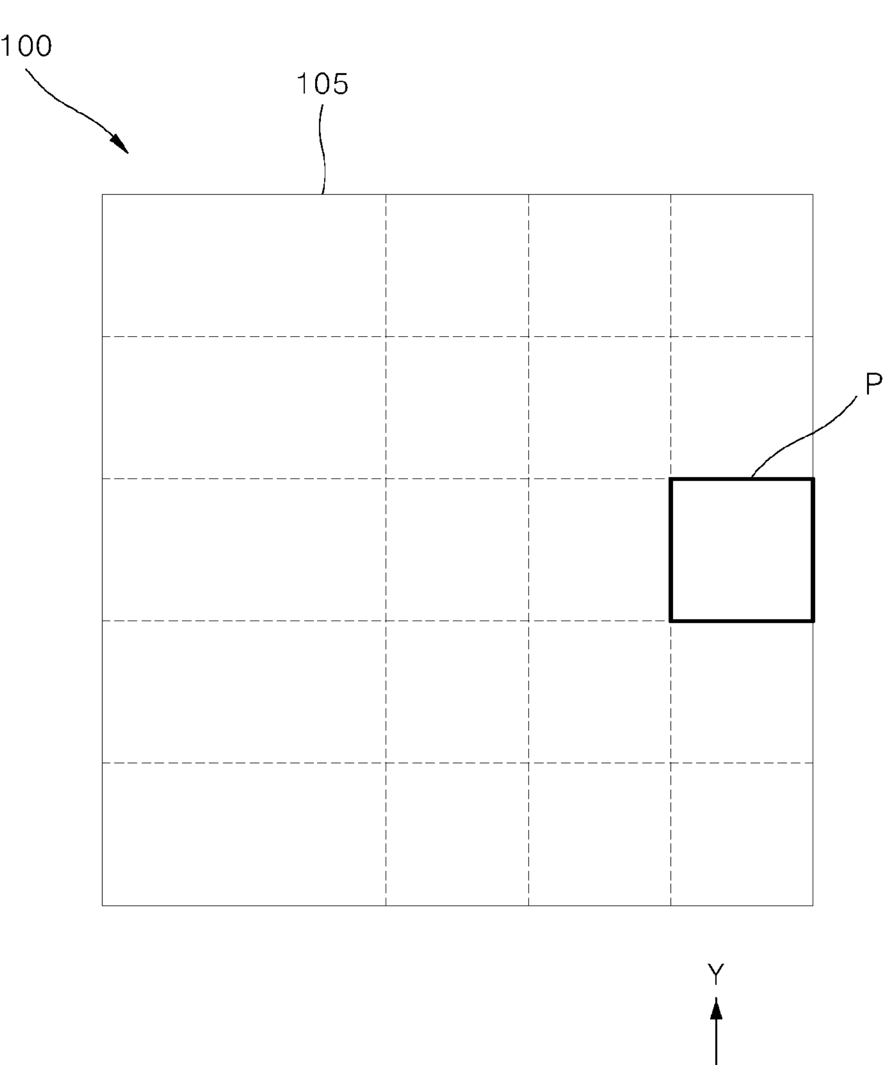
FIG. 1 is a plan view schematically showing a micro-LED display device according to a first embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, each of embodiments of the present disclosure will be described with reference to the accompanying drawings.

Figure 2:
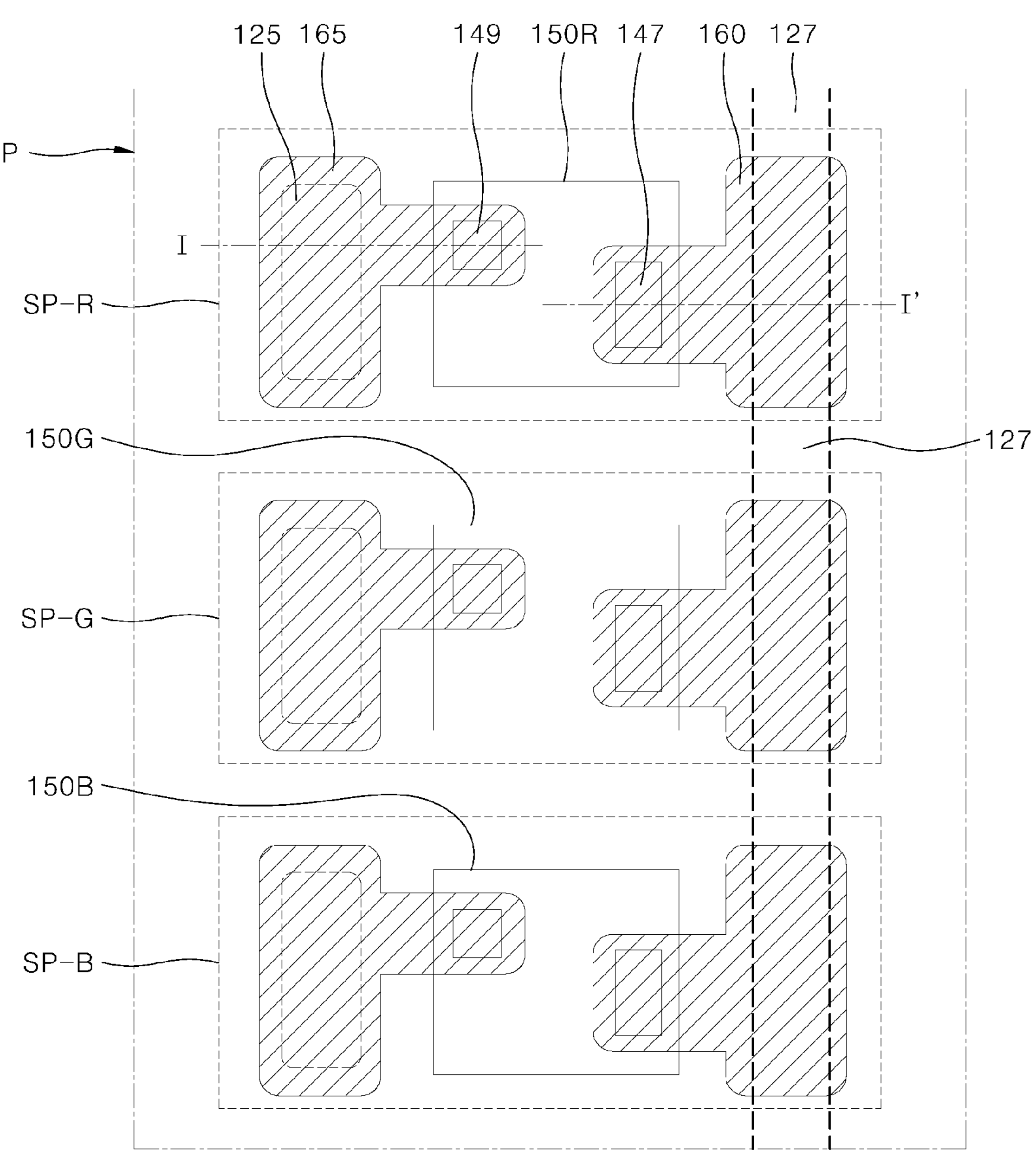
FIG. 2 is a plan view showing one unit pixel among unit pixels in FIG. 1 according to an embodiment of the present disclosure.

FIG. 1 is a plan view schematically showing a micro-LED display device according to a first embodiment of the present disclosure. FIG. 2 is a plan view showing one unit pixel among unit pixels of FIG. 1 according to an embodiment of the present disclosure.

Referring to FIG. 1 and FIG. 2, a micro-LED display device 100 according to the first embodiment of the present disclosure includes a substrate 105, and a plurality of unit-pixels P arranged in each of X-axis and Y-axis directions and disposed on the substrate 105.

One unit pixel P may include a plurality of sub-pixels SP-R, SP-G, and SP-B. The plurality of sub-pixel SP-R, SP-G, and SP-B may include the first sub-pixel SP-R equipped with a red light-emitting micro-LED 150R, the second sub-pixel SP-G equipped with a green light-emitting micro-LED 150G, and the third sub-pixel SP-B equipped with a blue light-emitting micro-LED 150B. In an embodiment of the present disclosure, an example in which the micro-LEDs 150R, 150G, and 150B respectively mounted in the plurality of sub-pixels SP-R, SP-G, and SP-B emit light of three colors of red, green, and blue, respectively is described. However, the number of sub-pixels and types of colors of light emitted therefrom are not limited thereto.

A first electrode 160 connected to a common voltage line 127 to apply a common voltage to each of the micro-LEDs 150R, 150G, and 150B may be disposed on each of the micro-LEDs 150R, 150G, and 150B respectively mounted in the sub-pixels SP-R, SP-G, and SP-B. A second electrode

165 connected to a data line for transferring a data signal to each of the micro-LEDs 150R, 150G, and 150B may be disposed on each of the micro-LEDs 150R, 150G, and 150B respectively mounted in the sub-pixels SP-R, SP-G, and SP-B. In this regard, the first electrode 160 may be referred to as a cathode electrode CE while the second electrode 165 may be referred to as an anode electrode AE.

Figure 3:
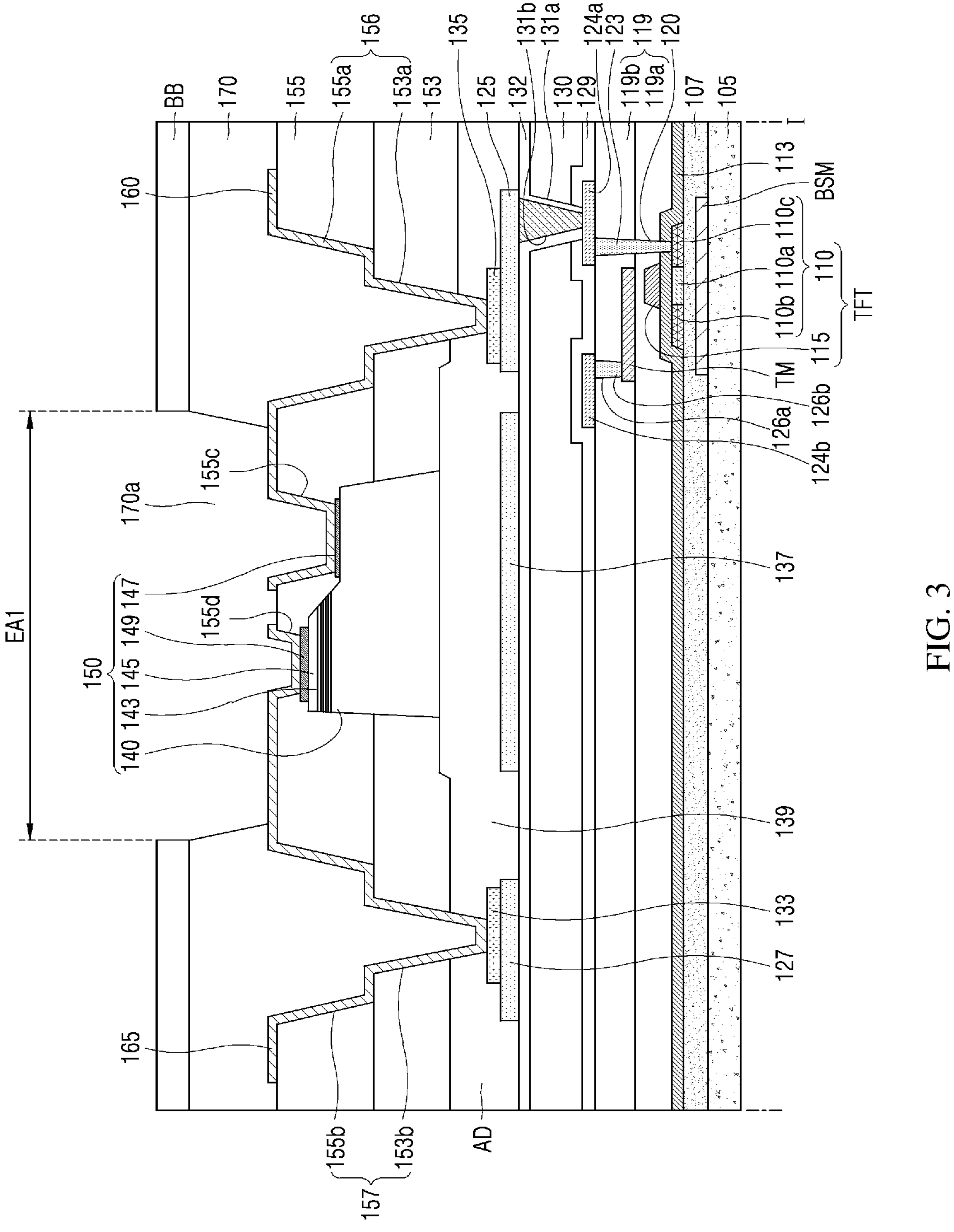
FIG. 3 is a cross-sectional view of one sub-pixel among sub-pixels in FIG. 2 as taken along a I-I' direction of the display device according to an embodiment of the present disclosure.

FIG. 3 is a cross-sectional view of one sub-pixel among the sub-pixels in FIG. 2 as taken along a I-I' direction of the display device according to an embodiment of the present disclosure.

Referring to FIG. 3, a thin-film transistor TFT is disposed on the substrate 105. The thin-film transistor TFT may include a semiconductor layer 110 formed on the substrate 105, a gate electrode 115 disposed on the semiconductor layer 110, and a gate insulating layer 113 disposed between the semiconductor layer 110 and the gate electrode 115, wherein the gate insulating layer 113 may be formed throughout an entire area of the substrate 105 so as to cover the semiconductor layer 110. A buffer insulating layer 107 may be disposed between the substrate 105 and the semiconductor layer 110. A light-blocking layer BSM may be disposed in the buffer insulating layer 107 and on the substrate 105. The light-blocking layer BSM may prevent light incident from a position under the substrate 105 from propagating to the semiconductor layer 110 of the thin-film transistor TFT, thereby reducing leakage current. For example, when the light is irradiated to the semiconductor layer 110, the leakage current may occur, and thus reliability of the thin-film transistor TFT may deteriorate. Therefore, the reliability of the thin-film transistor TFT may be improved by disposing the light-blocking layer BSM on the substrate 105 and in the buffer insulating layer 107. The light-blocking layer BSM may include an opaque conductive material.

The substrate 105 may be made of any transparent material including glass or plastic. The semiconductor layer 110 may include an active area 110*a* overlapping the gate electrode 115 so as to constitute a channel, and a source area 110*b* and a drain area 110*c* respectively disposed on both opposing sides of the active area 110*a* while the active area is interposed therebetween.

A first interlayer insulating film 119*a* is disposed on the gate electrode 115. A capacitor electrode TM may be disposed on the first interlayer insulating film 119*a* so as to partially overlap the gate electrode 115. A storage capacitor Cst may be composed of the capacitor electrode TM, the gate electrode 115, and the first interlayer insulating film 119*a* disposed between the capacitor electrode TM and the gate electrode 115 as a dielectric film. A second interlayer insulating film 119*b* may be disposed on the first interlayer insulating film 119*a* to constitute an interlayer insulating film 119 including the first and second interlayer insulating films 119*a* and 119*b*.

The interlayer insulating film 119 may receive therein a drain contact-hole 120 extending through the second interlayer insulating film 119*b*, the first interlayer insulating film 119*a*, and the gate insulating layer 113 so as to expose a portion of the drain area 110*c* of the semiconductor layer 110. The drain contact-hole 120 may be filled with a conductive material or a metal material to form a drain contact 123 electrically connected to the drain area 110*c*. Further, the interlayer insulating film 119 may receive therein a source contact-hole 126*a* extending through the second interlayer insulating film 119*b* so as to expose a portion of a surface of the capacitor electrode TM. The source contact-hole 126*a* may be filled with a conductive material or a metal material to form a source contact 126*b* electrically connected to the capacitor electrode TM. The capacitor electrode TM may be connected to another switching thin-film transistor.

A drain electrode 124*a* and a source electrode 124*b* may be disposed on the second interlayer insulating film 119*b*. The drain electrode 124*a* may be electrically connected to the thin-film transistor TFT via the drain contact 123. The source electrode 124*b* may be electrically connected to the capacitor electrode TM via the source contact 126*b*. The drain electrode 124*a* and the source electrode 124*b* may be disposed at the same vertical level.

A first protective layer 129 may be disposed on the second interlayer insulating film 119*b* so as to receive therein the drain electrode 124*a* and the source electrode 124*b*. The first protective layer 129 may include an insulating material. A first insulating layer 130 is disposed on the first protective layer 129. The first insulating layer 130 may include a positive type photoactive compound (PAC). The positive type photoactive compound includes a material in which a decomposition reaction occurs in an exposed portion thereof and thus, solubility of the exposed portion increases.

The first insulating layer 130 and the first protective layer 129 covering the source electrode 124*b* may have an opening 131*a* defined therein that selectively exposes an upper surface of the drain electrode 124*a*. A second protective layer 132 including an insulating material may be disposed on the first insulating layer 130 and an exposed surface of the opening 131*a*. A conductive material may fill the opening 131*a* to form a via contact 131*b*.

A connection electrode 125, a reflective layer 137, and the common voltage line 127 may be disposed on the via contact 131*b* and the second protective layer 132. The common voltage line 127 may be spaced apart from the data line and may extend in a parallel manner to the data line. The connection electrode 125, the reflective layer 137, and the common voltage line 127 may be disposed at the same vertical level. However, the present disclosure is not limited thereto. The connection electrode 125, the reflective layer 137, and the common voltage line 127 may be disposed at different vertical levels.

Conductive pads 133 and 135 respectively connected to the common voltage line 127 and the connection electrode 125 may be disposed. Each of the conductive pads 133 and 135 may include a conductive material or a metal material. The conductive pads 133 and 135 may include the first conductive pad 133 connected to the common voltage line 127 and the second conductive pad 135 connected to the connection electrode 125.

The reflective layer 137 is disposed on the second protective layer 132 and has a flat plate shape. The reflective layer 137 serves to reflect the light beam emitted toward the substrate 105 among the light beams emitted from the micro-LED 150 toward a light-emitting area EA1. The reflective layer 137 may include, but is not limited to, a metal material having good reflection ability.

An adhesive layer AD may be disposed on the connection electrode 125, the reflective layer 137, and the common voltage line 127. The adhesive layer AD bonds the micro-LED 150 onto the reflective layer 137. The adhesive layer AD may electrically insulate the reflective layer 137 made of a metal material from the micro-LED 150. The adhesive layer AD may be made of a heat curable material or a light curable material. However, the present disclosure is not limited thereto. In one example, FIG. 3 shows that the adhesive layer AD is disposed on an entire surface of the substrate 105. However, the adhesive layer AD may be disposed only in a partial area overlapping the reflective layer 137. However, the present disclosure is not limited thereto.

The micro-LED 150 is disposed on the adhesive layer AD. The micro-LED 150 may be positioned at a position corresponding to a position where the plate-shaped reflective layer 137 is disposed. The micro-LED 150 may include a first semiconductor layer 140, an active layer 143 disposed on one side of an upper surface of the first semiconductor layer 140, a second semiconductor layer 145 disposed on the active layer 143, a first pad electrode 147 disposed on the other side of the upper surface of the first semiconductor layer 140 on which the active layer 143 is not positioned, and a second pad electrode 149 disposed on the second semiconductor layer 145.

The first semiconductor layer 140 may supply electrons to the active layer 143, and may include a nitride semiconductor containing first conductivity type impurities. For example, the first conductivity-type impurity may include an N-type impurity. The nitride semiconductor may be a GaN-based semiconductor material including GaN, AlGaN, InGaN, or AlInGaN. The N-type impurities contained in the first semiconductor layer 140 may include silicon (Si), germanium (Ge), selenium (Se), or carbon (C). The first semiconductor layer 140 may further include an undoped nitride semiconductor layer (undoped GaN) as a lower portion thereof.

The active layer 143 disposed on one side of the upper surface of the first semiconductor layer 140 may act as a layer for emitting light, and may have a multi-quantum well (MQW) structure including a well layer and a barrier layer having a higher band gap than that of the well layer. For example, the well layer of the active layer 143 may be made of InGaN, while the barrier layer thereof may be made of AlGaN.

The second semiconductor layer 145 is formed on the active layer 143 and acts as a layer for injecting holes into the active layer 143. The second semiconductor layer 145 may include a nitride semiconductor containing a second conductivity type impurity. For example, the second conductivity type impurity may include a P type impurity. The nitride semiconductor may be a GaN-based semiconductor material including GaN, AlGaN, InGaN, or AlInGaN. The P-type impurity contained in the second semiconductor layer 145 may include manganese (Mg), zinc (Zn), or beryllium (Be). In accordance with an embodiment of the present disclosure, an example in which the first semiconductor layer 140 and the second semiconductor layer 145 are respectively made of the nitride semiconductor containing N-type impurities and the nitride semiconductor containing P-type impurities has been described. However, the present disclosure is not limited thereto. In another example, the first semiconductor layer 140 and the second semiconductor layer 145 may be made of a nitride semiconductor containing P-type impurities and a nitride semiconductor containing N-type impurities, respectively.

Each of the first pad electrode 147 and the second pad electrode 149 may be made of a material including at least one of a metal material such as Au, W, Pt, Si, Ir, Ag, Cu, Ni, Ti, and Cr, and an alloy thereof.

The active layer 143 may emit light via combination between the electrons and the holes respectively supplied from the first semiconductor layer 140 and the second semiconductor layer 145.

The micro-LED 150 may be covered with a second insulating layer 153 and a third insulating layer 155. The second insulating layer 153 and the third insulating layer 155 may include the same material, and may include, for example, a positive type photoactive material.

A first contact-hole 156 including a first via hole **153*a* and a second via hole 155*a* may extend through the adhesive layer AD, the second insulating layer 153, and the third insulating layer 155 so as to expose the second conductive pad 135. A second contact-hole 157 including a first via hole 153*b* and a second via hole 155*b* may extend through the adhesive layer AD, the second insulating layer 153, and the third insulating layer 155 so as to expose the first conductive pad 133. Further, a first pad contact-hole 155*c* and a second pad contact-hole 155*d* are formed in the third insulating layer 155 and are disposed on the first pad electrode 147 and the second pad electrode 149 of the micro-LED 150, respectively, such that a portion of an upper surface of each of the first pad electrode 147 and the second pad electrode 149** is exposed to an outside.

The first electrode 160 and the second electrode 165 may be disposed on the third insulating layer 155 so as to be respectively electrically connected to the drain electrode **124*a* and the common voltage line 127 of the thin-film transistor TFT. The first electrode 160 may be electrically connected to the first pad electrode 147 exposed through the first pad contact-hole 155*c*, and may extend along an exposed surface of each of the first contact-hole 156 so as to be connected to the second conductive pad 135. Thus, the first electrode 160 may be electrically connected to the thin-film transistor TFT via the connection electrode 125 and the drain electrode 124*a* connected to the second conductive pad 135. In this regard, the first electrode 160** may be referred to as the cathode electrode.

The second electrode 165 may be connected to the second pad electrode 149 exposed through the second pad contact-hole **155*d*, and may extend along an exposed surface of the second contact-hole 157 so as to be connected to the first conductive pad 133. Thus, the second electrode 165 may be electrically connected to the common voltage line 127 via the first conductive pad 133. The second electrode 165** may be referred to as the anode electrode.

The first electrode 160 and the second electrode 165 may be made of the same material and may include a transparent metal oxide such as indium-tin-oxide (ITO) or indium-zinc-oxide (IZO).

A bank 170 having a bank hole **170*a* defined therein is disposed on the third insulating layer 155 on which the first electrode 160 and the second electrode 165 have been formed. The bank 170 acts as a boundary area defining the light-emitting area EA1 and plays a role in defining each sub-pixel. Further, the bank 170 acts as a partitioning wall to prevent light beams of different colors respectively emitted from adjacent sub-pixels from being mixed with each other. The first contact-hole 156 and the second contact-hole 157 on which the first electrode 160 and the second electrode 165 have been respectively formed may be filled with a material constituting the bank 170. A black bank BB including an opaque material may be disposed on the bank 170**.

The micro-LED 150 may be electrically connected to the driving thin-film transistor TFT via the first electrode 160, and may be electrically connected to the common voltage line 127 via the second electrode 165 to emit light.

In one example, the display device including the micro-LED 150 may be manufactured by forming the micro-LED 150 using a separate substrate for growth and then transferring the micro-LED 150 onto the substrate 105 of the display device. In this case, a defect may occur in the micro-LED 150 itself. Alternatively, a defect in which a sub-pixel including a defective micro-LED 150 occurring due to a problem in the transfer process does not emit light may occur.

When the display device emits light while the sub-pixel including the defective micro-LED 150 remains, the sub-pixel may act as a dark spot to reduce the reliability of the display device. Accordingly, a repairing scheme for restoring the sub-pixel that acts as the dark spot to a normal pixel is applied.

In one repairing scheme, a portion where the defective micro-LED occurs is removed using a laser. However, the repairing scheme using the laser has a problem that even a normal micro-LED around the defective micro-LED may be damaged. Further, only one defective micro-LED may be repaired at a time in the repairing scheme using the laser, such that a lot of time is required when repairing a plurality of micro-LEDs is required, thereby reducing efficiency of a process.

In addition, when a lighting defect occurs after transferring the micro-LED onto the display device, it is difficult to repair the defective sub-pixel.

Accordingly, a second embodiment of the present disclosure relates to a display device that can restore a defective sub-pixel to a normal sub-pixel even when a lighting defect occurs after transferring the micro-LED onto the display device, without affecting the normal micro-LED around the defective micro-LED.

Figure 4:
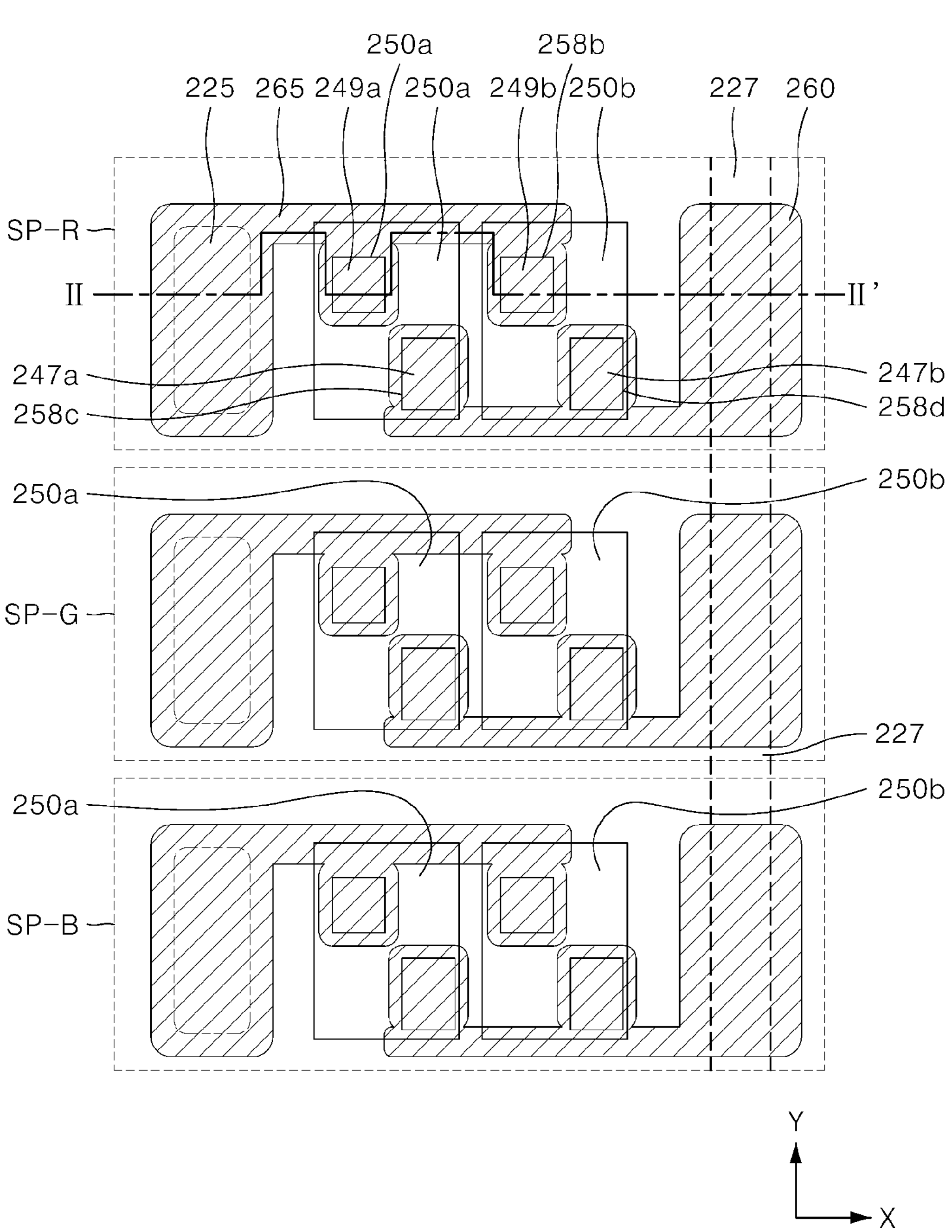
FIG. 4 is a plan view schematically showing sub-pixels of a display device according to a second embodiment of the present disclosure.
Figure 5:
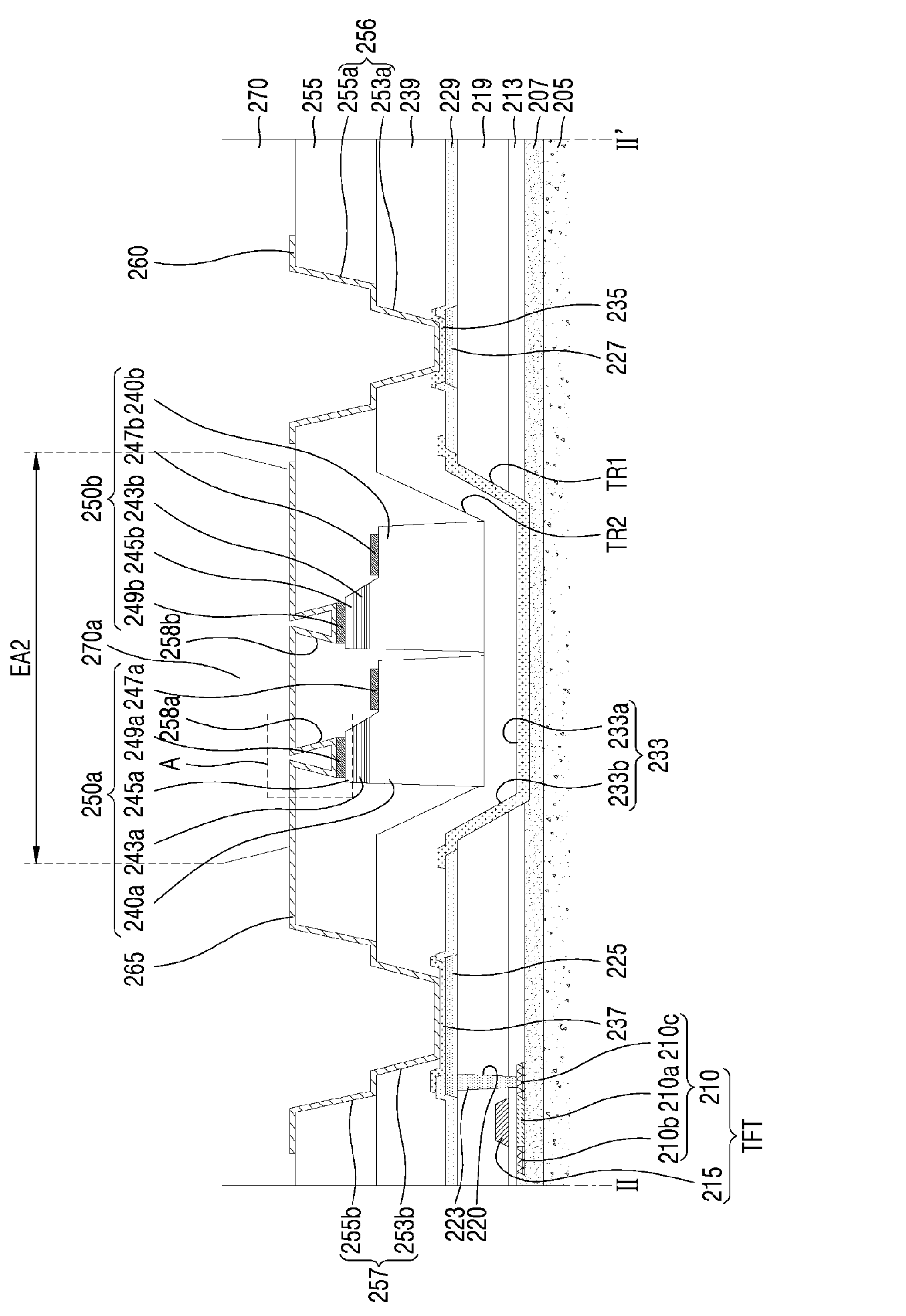
FIG. 5 is a cross-sectional view of one sub-pixel among the sub-pixels in FIG. 4 as taken along an II-II' direction of the display device according to an embodiment of the present disclosure.

FIG. 4 is a plan view schematically showing sub-pixels of a display device according to the second embodiment of the present disclosure. FIG. 5 is a cross-sectional view showing one sub-pixel among the sub-pixels in FIG. 4 as taken along an II-II' direction.

The micro-LED display device according to the second embodiment of the present disclosure may have a configuration in which a plurality of unit pixels P as shown in FIG. 1 are arranged in the X-axis and Y-axis directions. In following descriptions, one unit pixel P among a plurality of unit pixel P will be described by way of example.

Referring to FIGS. 4 and 5, one unit pixel P may include a plurality of sub-pixels SP-R, SP-G, and SP-B. The plurality of sub-pixels SP-R, SP-G, and SP-B may include the first sub-pixel SP-R emitting red light, the second sub-pixel SP-G emitting green light, and the third sub-pixel SP-B emitting blue light. In the second embodiment of the present disclosure, an example in which the plurality of sub-pixels SP-R, SP-G, and SP-B emit light of three colors of red, green, and blue, respectively is described. However, the present disclosure is not limited thereto. Further, in the second embodiment of the present disclosure, a configuration in which the first sub-pixel SP-R, the second sub-pixel SP-G, and the third sub-pixel SP-B are arranged in the Y-axis direction is described by way of example. However, the present disclosure is not limited thereto. In another example, the first sub-pixel SP-R, the second sub-pixel SP-G, and the third sub-pixel SP-B may be arranged in the X-axis direction.

Each of the sub-pixels SP-R, SP-G, and SP-B may include a first micro-LED 250*a* and a second micro-LED 250*b*. A common voltage line 227 for applying a common voltage and a data line for transferring a data signal may be disposed in each of the sub-pixels SP-R, SP-G, and SP-B. One first electrode 260 disposed on one side of each sub-pixel may be connected commonly to the first micro-LED 250*a* and the second micro-LED 250*b* at one side thereof. One second electrode 265 disposed on the other side of each sub-pixel may be connected commonly to the first micro-LED 250*a* and the second micro-LED 250*b* at the other side thereof. In this regard, the first electrode 260 may be connected to the common voltage line 227 for applying the common voltage, while the second electrode 265 may be connected to the data line for transferring the data signal. Accordingly, each of the same common voltage and the same data signal may be transferred to the first micro-LED 250*a* and the second micro-LED 250*b* disposed in one sub-pixel.

In the second embodiment of the present disclosure, a configuration in which the second electrode 265 is connected in parallel with the first micro-LED 250*a* and the second micro-LED 250*b* is described by way of example. However, the present disclosure is not limited thereto. For example, the second embodiment may include a configuration in which the second electrode 265 may be connected in series with the first micro-LED 250*a* and the second micro-LED 250*b*.

Referring to FIG. 5, a thin-film transistor TFT is disposed on the substrate 205. The thin-film transistor TFT may include a semiconductor layer 210 formed on the substrate 205, a gate electrode 215 disposed on the semiconductor layer 210, and a gate insulating layer 213 positioned between the semiconductor layer 210 and the gate electrode 215. A buffer insulating layer 207 is disposed between the substrate 205 and the semiconductor layer 210.

The substrate 205 may be made of any transparent material including glass or plastic. The buffer insulating layer 207 serves to prevent impurities from flowing in a direction from the substrate 205 to the micro-LED 250*a* and 250*b*, and may include an insulating material.

The gate electrode 215 may be embodied as a single layer or multiple layers made of one selected from a group consisting of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

The semiconductor layer 210 may include an active area 210*a* overlapping with the gate electrode 215 so as to constitute a channel, and a source area 210*b* and a drain area 210*c* respectively disposed on both opposing sides of the active area 210*a* interposed therebetween. The semiconductor layer 210 includes at least one of amorphous silicon, polycrystalline silicon, and oxide semiconductor. For example, the semiconductor layer 210 may include at least one of oxide semiconductor materials such as indium gallium zinc oxide (IGZO) and indium zinc oxide (IZO).

An interlayer insulating film 219 is disposed on the gate electrode 215. The interlayer insulating film 219 may receive therein a drain contact-hole 220 extending through the gate insulating layer 213 so as to expose a portion of the drain area 210*c* of the semiconductor layer 210. The drain contact-hole 220 may be filled with a conductive material or a metal material to form a drain electrode 223 electrically connected to the drain area 210*c*. Further, although not shown in the drawing, the interlayer insulating film 219 may receive therein a source contact-hole extending through the gate insulating layer 213 so as to expose a portion of the source area 210*b*. The source contact-hole may be filled with a conductive material or a metal material to form a source electrode (not shown) electrically connected to the source area 210*b*.

A first connection electrode 225 may be disposed on the interlayer insulating film 219 receiving therein the drain electrode 223 so as to be connected to an upper surface of the drain electrode 223. A common voltage line 227 may be disposed on the interlayer insulating film 219 and at a position spaced apart from the first connection electrode

225. The common voltage line 227 may be spaced apart from the data line and may extend in parallel therewith.

A protective layer 229 protecting the first connection electrode 225 and the common voltage line 227 is disposed on the interlayer insulating film 219. The protective layer 229 may have an opening defined therein in which each of the first connection electrode 225 and the common voltage line 227 is received such that an upper surface of each of the first connection electrode 225 and the common voltage line 227 is exposed.

Conductive pads 235 and 237 may be respectively disposed on the upper surfaces of the first connection electrode 225 and the common voltage line 227 as received in the openings of the protective layer 229. The conductive pads 235 and 237 may include the first conductive pad 235 connected to the common voltage line 227 and the second conductive pad 237 connected to the first connection electrode 225.

A first trench TR1 may be disposed on the buffer insulating layer 207 so as to extend through the protective layer 229, the interlayer insulating film 219, and the gate insulating layer 213. A reflective layer 233 may be disposed on an inner surface of the first trench TR1. The first and second conductive pads 235 and 237 and the reflective layer 233 may be positioned in the same layer and may be made of the same material.

The reflective layer 233 may be formed along a profile of the first trench TR1. Accordingly, the reflective layer 233 may have a concave profile and may have a bottom portion 233*a* (also referred to as "bottom") and both opposing sidewall portions 233*b* (also referred to as "opposing sides") vertically and inclinedly extending from the bottom portion 233*a*. The reflective layer 233 may reflect light beams emitted toward the substrate 205 among light beams emitted from the micro-LEDs 250*a* and 250*b* toward a light-emitting area EA2 direction, thereby improving light extraction efficiency. The reflective layer 233 may include, but is not limited to, a metal material having good reflection ability.

A first insulating layer 239 is disposed on the reflective layer 233. The first insulating layer 239 may include an organic insulating film. For example, the organic insulating film may include a positive type photoactive compound (P-PAC). The positive type photoactive compound includes a material in which a decomposition reaction occurs in an exposed portion thereof and thus, solubility of the exposed portion increases. For example, the positive type photoactive compound may include a positive type photo resist material. The first insulating layer 239 is disposed along the concave profile of the reflective layer 233 having the bottom portion 233*a* and both opposing sidewall portions 233*b*. Accordingly, the first insulating layer 239 may have a second trench TR2 defined therein having a concave profile and having a bottom surface and both opposing side surfaces.

The first micro-LED 250*a* and the second micro-LED 250*b* are disposed on the first insulating layer 239. The first and second micro-LEDs 250*a* and 250*b* may be positioned in an area corresponding to a position where the reflective layer 233 is disposed. The second trench TR2 having the concave profile and having the bottom surface and both opposing side surfaces serves to define an area to which the first micro-LED 250*a* and the second micro-LED 250*b* are transferred. Accordingly, the first and second micro-LEDs 250*a* and 250*b* may be prevented from being transferred to a wrong position. Accordingly, occurrence of defects due to transfer error of the micro-LED may be reduced.

Further, the first insulating layer 239 has the second trench TR2 defined therein having the bottom surface positioned at a vertical level lower than that of an upper surface of the interlayer insulating film 219. The first and second micro-LEDs 250*a* and 250*b* are disposed on the bottom surface of the second trench TR2 defined in the first insulating layer 239. Accordingly, the first and second micro-LEDs 250*a* and 250*b* may be positioned at a vertical level relatively lower than that of the micro-LED 150 positioned above a top face of the protective layer 129 of FIG. 3. Thus, a total thickness of the display device may be reduced.

An example in which the second electrode 265 according to the second embodiment of the present disclosure are connected in parallel with the first micro-LED 250*a* and the second micro-LED 250*b* is described. However, the present disclosure is not limited thereto. In another example, the second electrode 265 may be connected in series with the first micro-LED 250*a* and the second micro-LED 250*b*.

The first micro-LED 250*a* may include a first semiconductor layer 240*a*, an active layer 243*a* disposed on one side of an upper face of the first semiconductor layer 240*a*, a second semiconductor layer 245*a* disposed on the active layer 243*a*, a first pad electrode 247*a* disposed on the other side of the upper surface of the first semiconductor layer 240*a* on which the active layer 243*a* is not positioned, and a second pad electrode 249*a* disposed on the second semiconductor layer 245*a*. The first micro-LED 250*a* may be referred to as a first light-emitting element.

The second micro-LED 250*b* is adjacent to the first micro-LED 250*a*, and may include a first semiconductor layer 240*b*, an active layer 243*b* disposed on one side of an upper surface of the first semiconductor layer 240*b*, a second semiconductor layer 245*b* disposed on the active layer 243*b*, a first pad electrode 247*b* disposed on the other side of the upper surface of the first semiconductor layer 240*b* on which the active layer 243*b* is not positioned, and a second pad electrode 249*b* disposed on the second semiconductor layer 245*b*. The second micro-LED 250*b* may also be referred to as a second light-emitting element.

Each of the first semiconductor layers 240*a* and 240*b* of the first and second micro-LEDs 250*a* and 250*b* may supply electrons to each of the active layers 243*a* and 243*b*, and may include a nitride semiconductor containing the first conductivity-type impurity. For example, the first conductivity-type impurity may include an N-type impurity. The nitride semiconductor may include a GaN-based semiconductor material including GaN, AlGaN, InGaN, or AlInGaN. The N-type impurities contained in each of the first semiconductor layers 240*a* and 240*b* may include silicon (Si), germanium (Ge), selenium (Se), or carbon (C). Each of the first semiconductor layers 240*a* and 240*b* may further include an undoped nitride semiconductor layer (undoped GaN) as a lower portion thereof.

Each of the active layers 243*a* and 243*b* disposed on one side of the upper surface of each of the first semiconductor layers 240*a* and 240*b* may act as a layer for emitting light, and may have a multi-quantum well (MQW) structure including a well layer and a barrier layer having a higher band gap than that of the well layer. For example, the well layer of each of the active layers 243*a* and 243*b* may be made of InGaN, while the barrier layer thereof may be made of AlGaN.

The second semiconductor layers 245*a* and 245*b* of the first and second micro-LEDs 250*a* and 250*b* are respectively formed on the active layers 243*a* and 243*b* so as to inject holes into the active layers 243*a* and 243*b*, respectively. Each of the second semiconductor layers 245*a* and 245*b* may include a nitride semiconductor containing a second conductivity type impurity. For example, the second conductivity type impurity may include a P type impurity. The nitride semiconductor may include a GaN-based semiconductor material including GaN, AlGaN, InGaN, or AlInGaN. The P-type impurity contained in each of the second semiconductor layers 245*a* and 245*b* may include manganese (Mg), zinc (Zn), or beryllium (Be). In an embodiment of the present disclosure, an example in which each of the first semiconductor layers 240*a* and 240*b* and each of the second semiconductor layers 245*a* and 245*b* are made of a nitride semiconductor containing N-type impurities and a nitride semiconductor containing P-type impurities, respectively has been described. However, the present disclosure is not limited thereto. In another example, each of the first semiconductor layers 240*a* and 240*b* and each of the second semiconductor layers 245*a* and 245*b* may be made of a nitride semiconductor containing P-type impurities and a nitride semiconductor containing N-type impurities, respectively.

Each of the first pad electrodes 247*a* and 247*b* and the second pad electrodes 249*a* and 249*b* of the first and second micro-LEDs 250*a* and 250*b* may be made of at least one of a metal such as Au, W, Pt, Si, Ir, Ag, Cu, Ni, Ti, Cr, etc. and an alloy thereof.

The active layer 243*a* of the first micro-LED 250*a* may emit light via combination of electrons and holes respectively supplied from the first semiconductor layer 240*a* and the second semiconductor layer 245*a*. Further, the active layer 243*b* of the second micro-LED 250*b* may emit light via combination of electrons and holes respectively supplied from the first semiconductor layer 240*b* and the second semiconductor layer 245*b*.

Each of the first and second micro-LEDs 250*a* and 250*b* may be covered with a second insulating layer 255.

The first insulating layer 239 and the second insulating layer 255 receive therein each of a first contact-hole 256 including a first via hole 253*a* and a second via hole 255*a*, and a second contact-hole 257 including a first via hole 253*b* and a second via hole 255*b*. The first contact-hole 256 and the second contact-hole 257 may respectively expose portions of surfaces of the first conductive pad 235 and the second conductive pad 237.

The second insulating layer 255 may receive therein pad contact-holes 258*a* and 258*b* exposing portions of upper surfaces of the second pad electrodes 249*a* and 249*b* of the first and second micro-LEDs 250*a* and 250*b*, respectively. In this regard, the pad contact-holes 258*a* and 258*b* may include the first pad contact-hole 258*a* exposing the second pad electrode 249*a* of the first micro-LED 250*a* and the second pad contact-hole 258*b* exposing the second pad electrode 249*b* of the second micro-LED 250*b*.

Further, as shown in FIG. 4, the second insulating layer 255 receives therein pad contact-holes 258*c* and 258*d* exposing portions of the upper surfaces of the first pad electrodes 247*a* and 247*b* of the first and second micro-LEDs 250*a* and 250*b*, respectively. In this regard, the pad contact-holes 258*c* and 258*d* may include the third pad contact-hole 258*c* which exposes the first pad electrode 247*a* of the first micro-LED 250*a*, and the fourth pad contact-hole 258*d* which exposes the first pad electrode 247*b* of the second micro-LED 250*b*.

The second insulating layer 255 may include an organic insulating film. The second insulating layer 255 may include an organic insulating film of a different type from that of the first insulating layer 239. For example, the organic insulating film constituting the second insulating layer 255 preferably includes a negative-type photoactive compound (N-PAC). The negative type photoactive compound includes a material in which an exposed portion thereof is cross-linked, and thus, solubility of the exposed portion is reduced. In one example, the negative type photoactive compound may include a negative type photo resist material.

According to the second embodiment of the present disclosure, the second insulating layer 255 positioned between the first pad contact-hole 258*a* and the second pad contact-hole 258*b* may have a reverse tapered shape in which a top is wider and a bottom is narrower in a cross-sectional view. Thus, each of the first pad contact-hole 258*a* and the second pad contact-hole 258*b* defined in the second insulating layer 255 according to the second embodiment of the present disclosure may have a tapered shape. Accordingly, each of the first and second pad contact-holes 258*a* and 258*b* defined in the second insulating layer 255 may have a narrow top and a wide bottom.

The first electrode 260 and the second electrode 265 may be disposed on the second insulating layer 255 so as to be electrically connected to the common voltage line 227 and the drain electrode 223 of the thin-film transistor TFT, respectively. The first electrode 260 may extend along an exposed surface of the first contact-hole 256 and may be electrically connected to the common voltage line 227 via the first conductive pad 235. The first electrode 260 may extend along the third and fourth pad contact-holes 258*c* and 258*d* (see FIG. 4) and may be connected to the first pad electrodes 247*a* and 247*b*. Accordingly, as shown in FIG. 4, the first pad electrode 247*a* of the first micro-LED 250*a* and the first pad electrode 247*b* of the second micro-LED 250*b* may be electrically connected to each other via one first electrode 260.

The second electrode 265 may be connected to the second pad electrode 249*a* of the first micro-LED 250*a*, and may extend to the second pad electrode 249*b* of the second micro-LED 250*b*. Accordingly, the second pad electrode 249*a* of the first micro-LED 250*a* and the second pad electrode 249*b* of the second micro-LED 250*b* may be electrically connected to each other via one second electrode 265.

As the first micro-LED 250*a* and the second micro-LED 250*b* are electrically connected to each other via one second electrode 265, a defective light-emitting element occurring in the two micro-LEDs 250*a* and 250*b* may be easily excluded. A detailed description thereof will be made later.

The second electrode 265 may be disposed on and extend along an exposed surface of each of the first pad contact-hole 258*a* of the first micro-LED 250*a* and the first pad contact-hole 258*b* of the second micro-LED 250*b* so as to be connected to each of the second pad electrodes 249*a* and 249*b*. The second electrode 265 may extend along an exposed surface of the second contact-hole 257 and may be electrically connected to the first connection electrode 225 and the drain electrode 223 via the second conductive pad 237.

The first electrode 260 and the second electrode 265 may be made of the same material. For example, each of the first electrode 260 and the second electrode 265 may include a transparent metal oxide such as indium-tin-oxide (ITO) or indium-zinc-oxide (IZO).

Each of the first and second pad contact-holes 258*a* and 258*b* formed in the second insulating layer 255 has a tapered shape in which the upper opening is narrower due to a horizontally protruding portion of the second insulating layer 255 and a width increases as each of the first and second pad contact-holes 258*a* and 258*b* extends downwardly. In this regard, as the second electrode 265 is formed along an exposed surface of the second insulating layer 255 having the reverse tapered shape, the second electrode 265 may also have a reverse tapered shape.

The second electrode 265 formed on the exposed surface of each of the first and second pad contact-holes 258*a* and 258*b* defined in the second insulating layer 255 and having the reverse tapered shape may have a relatively smaller thickness on a side surface of each of the first and second pad contact-holes 258*a* and 258*b* than a target deposition thickness, compared to that on a bottom surface thereof, due to structural characteristics of the reverse tapered shape of the second insulating layer 255.

In the second embodiment of the present disclosure, a configuration in which the second electrode 265 has the reverse tapered shape is described for convenience of illustration. However, the present disclosure is not limited thereto. In another example, the second insulating layer 255 extending along the exposed surface of each of the third pad contact-hole 258*c* and the fourth pad contact-hole 258*d* (see FIG. 4) respectively exposing portions of upper surfaces of the first pad electrodes 247*a* and 247*b* may have the reverse tapered shape. Accordingly, an upper opening of each of the third and fourth pad contact-holes 258*c* and 258*d* formed in the second insulating layer 255 may have a narrower width due to a horizontally protruding portion of the second insulating layer 255 and a width thereof increases as each of the third and fourth pad contact-holes 258*c* and 258*d* extends toward a bottom thereof. The first electrode 260 formed along the exposed surface of each of the third and fourth pad contact-holes 258*c* and 258*d* may also have the reverse tapered shape.

In other words, according to an embodiment of the present disclosure, only the first electrode 260 may be formed to have the reverse tapered shape, or only the second electrode 265 may be formed to have the reverse tapered shape, or both the first electrode 260 and the second electrode 265 may have the reverse tapered shape.

A bank 270 having a bank hole 270*a* defined therein is disposed on the second insulating layer 255 on which the first electrode 260 and the second electrode 265 have been formed. The bank hole 270*a* may expose the first electrode 260 disposed on the first micro-LED 250*a* and the second micro-LED 250*b*. The bank 270 may act as a boundary area defining the light-emitting area EA2, and may serve to define each sub-pixel. Further, the bank 270 may act as a partitioning wall to prevent light beams of different colors respectively emitted from adjacent different pixels from being mixed with each other. A remaining portion of each of the first contact-hole 256 and the second contact-hole 257 after the first electrode 260 and the second electrode 265 have respectively filled a portion of the first contact-hole 256 and a portion of the second contact-hole 257 may be filled with a material constituting the bank 270.

The first micro-LED 250*a* and the second micro-LED 250*b* are electrically connected to the common voltage line 227 via the first electrode 260, and is electrically connected to the driving thin-film transistor TFT via the second electrode 265. Then, electrons and holes are supplied to the active layers 243*a* and 243*b* of the first and second micro-LEDs 250*a* and 250*b*, respectively. Thus, the first and second micro-LEDs 250*a* and 250*b* may emit light via recombination between the supplied electrons and holes.

As described above, the first micro-LED 250*a* and the second micro-LED 250*b* are electrically connected to each other via one second electrode 265. Thus, when a defect occurs in one among the two micro-LEDs 250*a* and 250*b*, the micro-LED with the defect may be easily excluded.

Specifically, in an embodiment of the present disclosure, the micro-LED with the defect may be excluded using electromigration as a phenomenon that metal atoms of a metal wiring can migrate based on flow of electrons, thereby causing discontinuity (an open state) of the wiring.

The electromigration phenomenon occurs when a current with a current density higher than a certain level flows through the metal wiring. This electromigration phenomenon may be further increased under a condition of high temperature, due to Joule heating JH and an increase in a diffusion coefficient of the metal atoms. In other words, the temperature may be raised due to the Joule heating so as to further accelerate the mobility of electrons such that the occurrence of the electromigration may be further accelerated. In an embodiment of the present disclosure, the electromigration may be easily induced on the micro-LED with the defect so as to disconnect the defective micro-LED from the first or second electrode.

This will be described with reference to the drawings.

Figure 6:
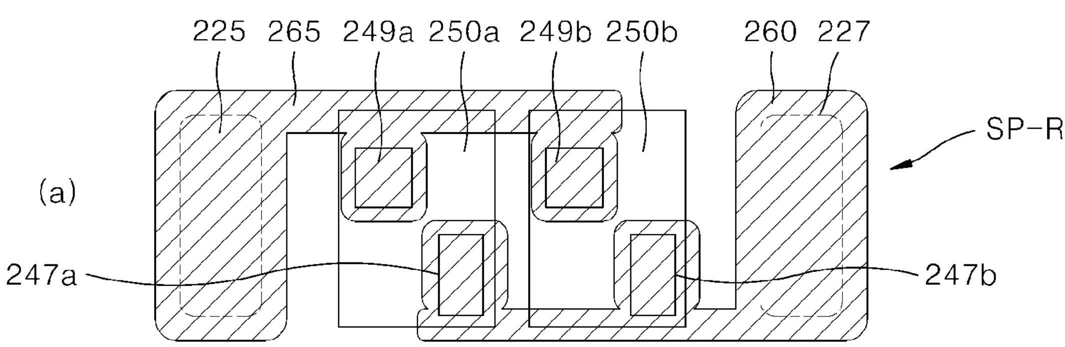
FIG. 6 is a diagram for illustrating a repairing method in a display device according to an embodiment of the present disclosure.
Figure 6:
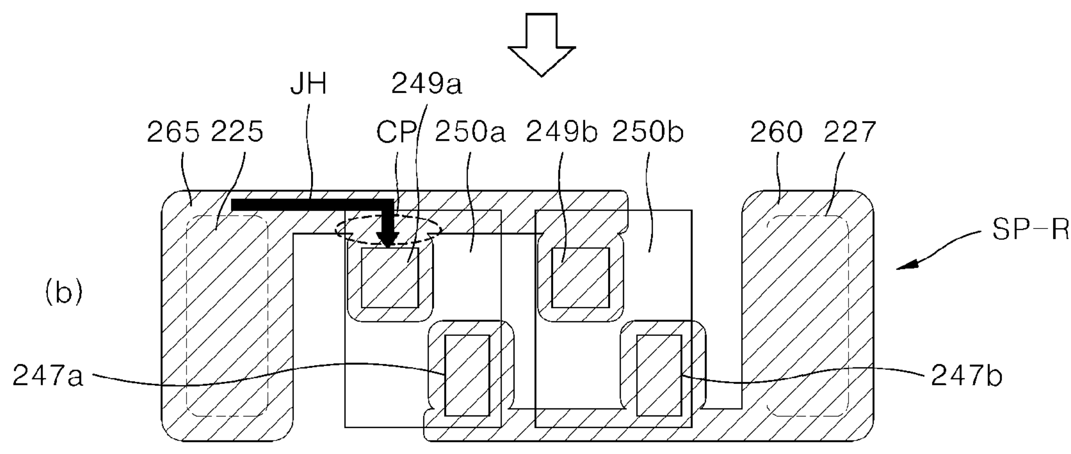
Figure 6:
Figure 6:
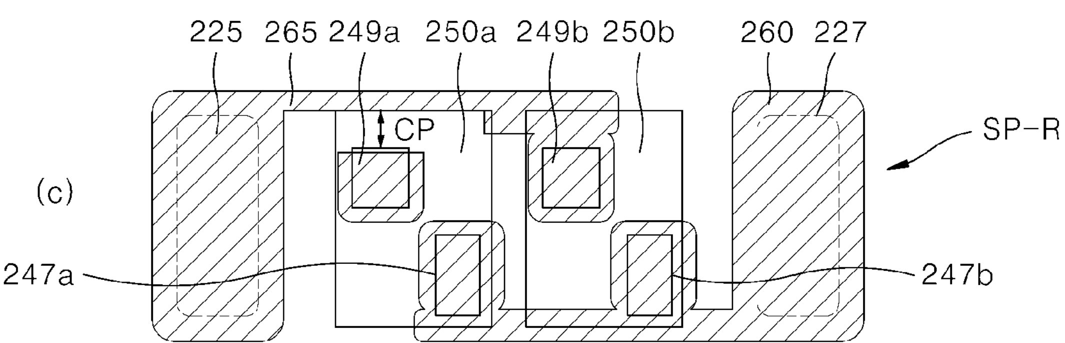

FIG. 6 is a diagram for illustrating a repairing method in a display device according to an embodiment of the present disclosure.

In one example, as shown in FIG. 6, when a defect occurs in one sub-pixel SP-R among a plurality of sub-pixels, the micro-LED in which the defect occurs among the first and second micro-LEDs 250*a* and 250*b* may be selectively excluded. Specifically, when a defect occurs in the first micro-LED 250*a* among the two micro-LEDs 250*a* and 250*b* shown in part (a) of FIG. 6, a current having a current amount that may cause Joule-heat JH is supplied to the first micro-LED 250*a* in which the defect has occurred as shown in part (b) of FIG. 6.

The Joule-heat JH can induce and accelerate the electromigration, thereby breaking the second electrode 265 which supplies the current to the first micro-LED 250*a* at a breaking point or cutting point CP of the second electrode 265 shown in part (c) of FIG. 6. Then, as the current supplied via the second electrode 265 is supplied only to the second micro-LED 250*b*, and thus the first micro-LED 250*a* is excluded from the light-emitting process, the sub-pixel SP-R where the defective micro-LED is positioned may be restored to a normal sub-pixel. In this case, there occurs an effect of repairing a sub-pixel with a defect to a normal sub-pixel without carrying out an additional process to remove the defective micro-LED from the substrate.

To easily induce the discontinuity of the second electrode 265 supplying the current to the first micro-LED 250*a* where the defect has occurred, the second electrode 265 formed in the first and second pad contact-holes 258*a* and 258*b* may be formed to have a relatively smaller thickness of a sidewall on the side surface of each of the first and second pad contact-holes 258*a* and 258*b*, thereby inducing the breaking point CP. A portion of the second electrode 265 disposed on and extending along a side surface of each of the first and second pad contact-holes 258*a* and 258*b* may have a thickness smaller than a thickness of each of a portion of the second electrode 265 disposed on a top face of the second insulating layer and a portion of the second electrode 265 disposed on and along a bottom of each of the first and second pad contact-holes 258*a* and 258*b*. In order to achieve a relatively smaller thickness at the breaking point CP so that Joule heating JH can be easily generated, each of the first and second pad contact-holes 258*a* and 258*b* may have various shapes. This will be described with reference to the drawings below.

Figure 7:
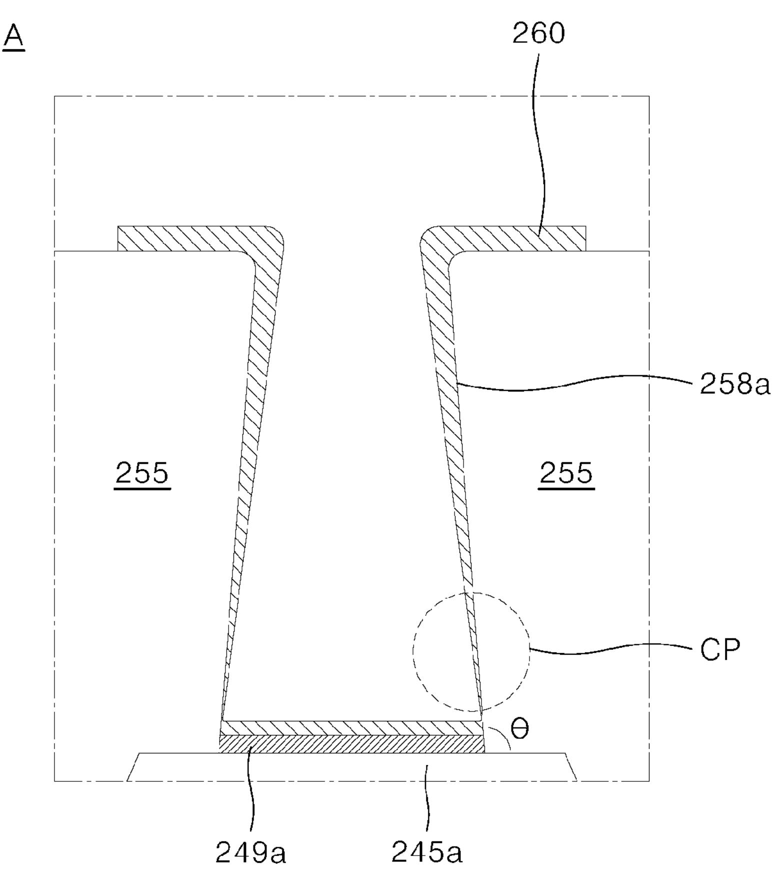
FIG. 7 is a diagram for illustrating a first or second pad contact-hole according to an embodiment of the present disclosure.
Figure 8A:
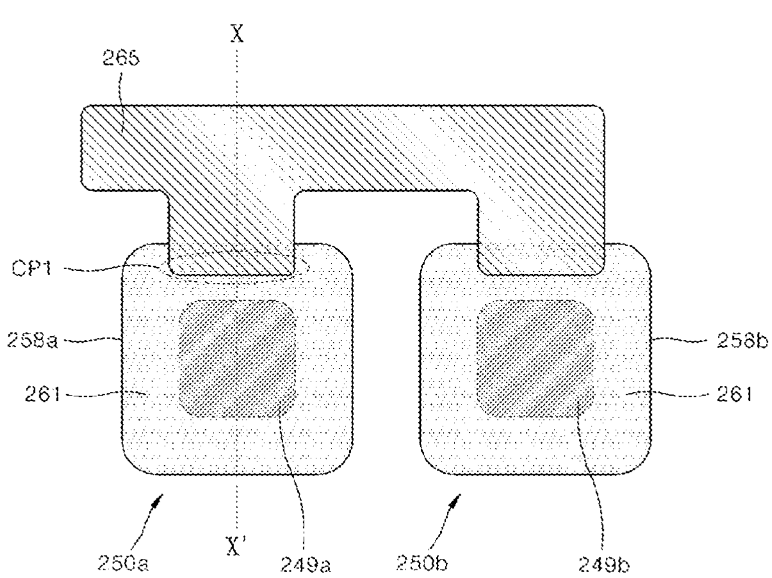
FIG. 8A and FIG. 8B are diagrams for illustrating a first or second pad contact-hole according to another embodiment of the present disclosure.
Figure 8B:
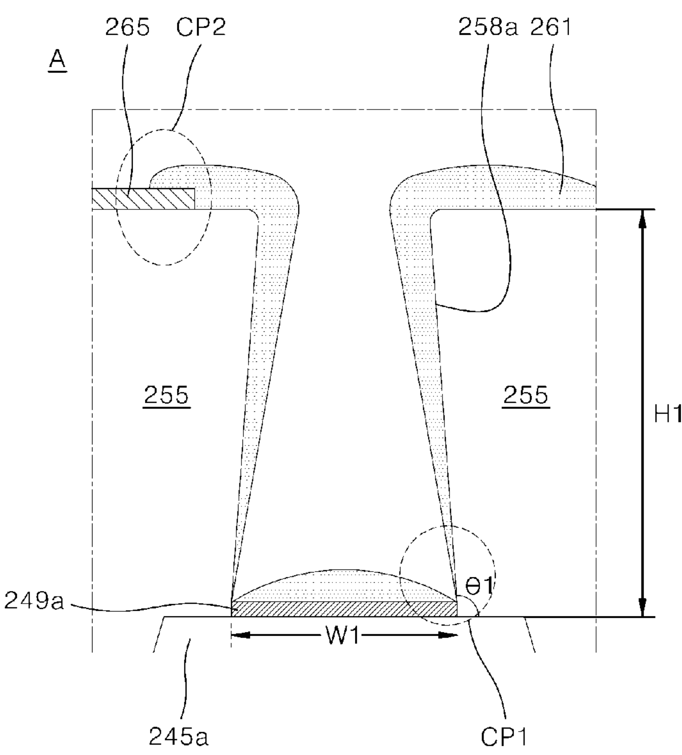
Figure 9A:
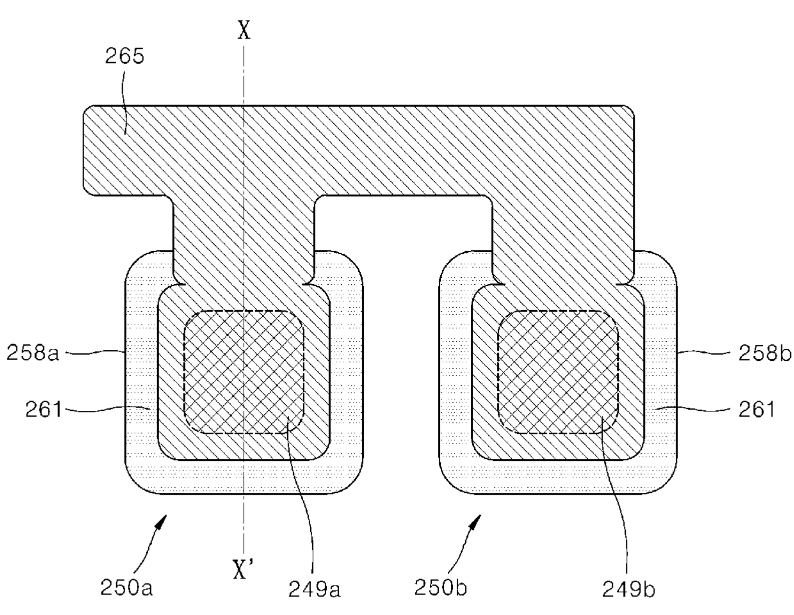
FIG. 9A and FIG. 9B are diagrams for illustrating a first or second pad contact-hole according to still another embodiment of the present disclosure.
Figure 9B:
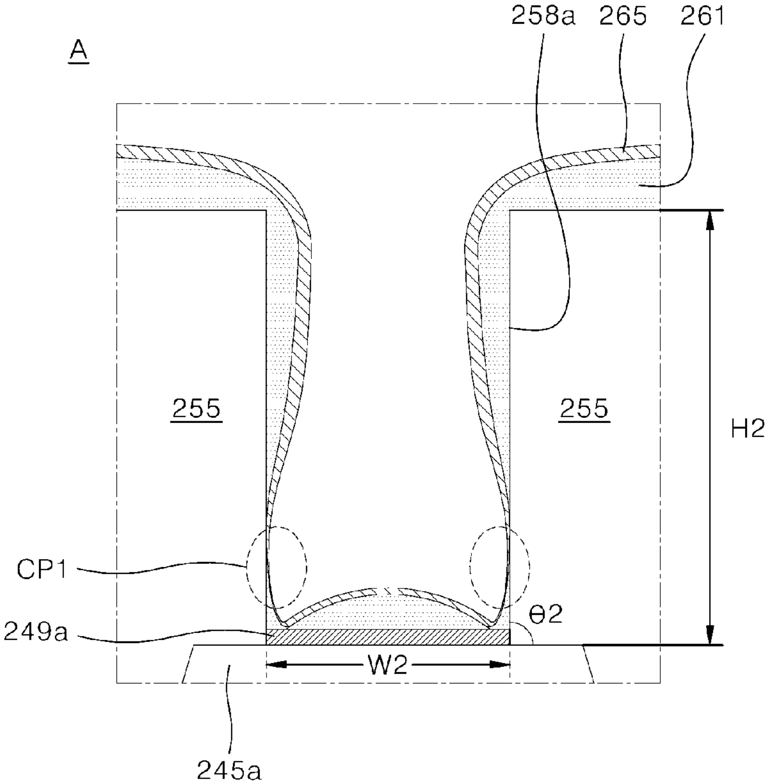

FIG. 7 is a diagram for illustrating a first or second pad contact-hole according to one embodiment. FIG. 7 is an enlarged view of an 'A' portion of FIG. 5. FIG. 8A and FIG. 8B are diagrams for illustrating a first or second pad contact-hole according to another embodiment. FIG. 9A and FIG. 9B are diagrams for illustrating a first or second pad contact-hole according to still another embodiment. In this regard, FIG. 8B and FIG. 9B are respective views showing FIG. 8A and FIG. 9A as cut in a X-X' direction.

Referring to FIG. 7, the first pad contact-hole 258*a* formed in the second insulating layer 255 has the tapered shape in which a top is narrow, and a bottom is wide. The second electrode 265 formed in the first pad contact-hole 258*a* may have a relatively smaller thickness of a portion of a sidewall thereof on the side surface of the first pad contact-hole 258*a* closer to the bottom of the first pad contact-hole 258 than a thickness of a portion of the sidewall of the second electrode 265 closer to a top of the first pad contact-hole 258. In this regard, a slope θ between a sidewall of the second insulating layer 255 and the top face of the second semiconductor layer 245*a* may be greater than 90 degrees. As the slope between the side surface and the bottom surface of the first pad contact hole 258*a* is smaller than 90 degrees, the profile of the second insulating layer 255 may have a reverse tapered shape having a larger slope. A point with the relatively smallest thickness acts as the breaking point CP.

Specifically, as described above, when the Joule-heat is generated by increasing the amount of current flowing to the defective micro-LED, the electromigration may occur at the breaking point CP and thus the second electrode 265 may be broken.

Referring to FIGS. 8A and 8B, in another example, the first pad contact-hole 258*a* formed in the second insulating layer 255 has the tapered shape in which a top is narrow, and a bottom is wide. A slope θ1 between the sidewall of the second insulating layer 255 and the second semiconductor layer 245*a* may be greater than 90 degrees. As the slope between the side surface and the bottom surface of the first pad contact hole 258*a* is smaller than 90 degrees, the profile of the second insulating layer 255 may have the reverse tapered shape having a larger slope.

In FIG. 8A and FIG. 8B, the second electrode 265 is disposed on the upper surface of the second insulating layer 255, and a conductive organic material layer 261 is formed on the second electrode 265 and along a profile of the first pad contact-hole 258*a*. The conductive organic material layer 261 may be made of a material with a poor step coverage and a melting point lower than that of the metal material. Accordingly, the conductive organic material layer 261 has a relatively smaller thickness at a portion of a sidewall thereof close to the bottom of the first pad contact-hole 258*a* than that a portion of the sidewall thereof closer to a top of the first pad contact-hole 258*a*. A portion of the conductive organic material layer 261 disposed on and extending along the side surface of each of the first and second pad contact-holes 258*a* and 258*b* may have a thickness smaller than a thickness of a portion of the conductive organic material layer 261 disposed on a top face of the second insulating layer or a thickness of a portion of the conductive organic material layer 261 disposed on and extending along the bottom of each of the first and second pad contact-holes 258*a* and 258*b*. A point with the relatively smallest thickness of the conductive organic material layer 261 may act as a breaking point at which the second electrode 265 becomes discontinuous when the Joule heating is generated.

Then, a second breaking point CP2 may be positioned at a contact area where the second electrode 265 and the conductive organic material layer 261 contact each other. A first breaking point CP1 may be positioned at a point of the sidewall of the conductive organic material layer 261 close to the bottom of the first pad contact-hole 258*a*. At the second breaking point CP2 where the second electrode 265 and the conductive organic material layer 261 are in contact with each other, discontinuity may easily occur due to relatively high contact resistance thereat. Further, as the melting point of the conductive organic material layer 261 is lower than that of the metal material, a temperature at which the electromigration may occur may be lowered, so that the electromigration may occur more easily.

Referring to FIGS. 9A and 9B, in still another embodiment, the conductive organic material layer 261 is disposed along portions of the first pad contact-hole 258*a*. The conductive organic material layer 261 may be formed to cover the side surface and the bottom surface of the first pad contact-hole 258*a* and may be disposed on the upper surface of the second insulating layer 255.

A slope θ2 between an inner side surface of the conductive organic material layer 261 and the second semiconductor layer 245*a* may be greater than 90 degrees. As the slope between the side surface and the bottom surface of the first pad contact hole 258*a* is smaller than 90 degrees, the profile of the second insulating layer 255 may have the reverse tapered shape having a larger slope.

The conductive organic material layer 261 has a relatively smaller thickness of a portion of a sidewall thereof closer to the bottom of the first pad contact-hole 258*a* than a portion of the sidewall thereof closer to a top of the first pad contact-hole 258*a*. The second electrode 265 may be disposed on an exposed surface of the conductive organic material layer 261. Then, the side face of the first pad contact-hole 258*a* may be covered with a double layer structure of the conductive organic material layer 261 and the second electrode 265. Accordingly, a point with the relatively smallest thickness of the double layer structure may act as a breaking point at which the second electrode 265 becomes discontinuous when the Joule heating is generated. Thus, the first breaking point CP1 may be positioned at each of both opposing sidewalls of the double layer structure close to the bottom of the first pad contact-hole 258*a*.

As described above, the breaking points CP, CP1 and CP2 having the relatively smallest thickness of the sidewall of the conductive layer and/or electrode are disposed on the side surface of the first pad contact-hole 258*a* formed in the second insulating layer 255 having the reverse tapered shape. Thus, the second electrode 265 which supplies the current to the first micro-LED 250*a* where the defect has occurred may be easily broken to facilitate the repairing process of the defective sub-pixel. In an embodiment of the present disclosure, a case in which the first micro-LED 250*a* is defective has been described. However, the present disclosure is not limited thereto. For example, the breaking point as described above may be defined at a side face of the second pad contact-hole 258*b* related to the second micro-LED 250*b*.

Further, in an embodiment of the present disclosure, a configuration for making the second electrode 265 discontinuous is described for convenience of description. However, the present disclosure is not limited thereto. In one example, the breaking point may be applied to a configuration for making the first electrode 260 electrically connected to the common voltage line discontinuous. In this case, the breaking point may occur at each of the third pad contact-hole 258*c* (see FIG. 4) and the fourth pad contact-hole 258*d* (see FIG. 4) along which the first electrode 260 is formed. Further, the breaking point may occur at each of the first to fourth pad contact-hole 258*a*, 258*b*, 258*c*, and 258*d*.

Further, JH-related current amounts required in the first sub-pixel SP-R emitting red light, the second sub-pixel SP-G emitting green light, and the third sub-pixel SP-B emitting blue light are different from each other. Accordingly, a size of each of the first to fourth pad contact-holes 258*a*, 258*b*, 258*c*, and 258*d* disposed in the first sub-pixel SP-R emitting red light, a size of each of the first to fourth pad contact-holes 258*a*, 258*b*, 258*c*, and 258*d* disposed in the second sub-pixel SP-R emitting green light, and a size of each of the first to fourth pad contact-holes 258*a*, 258*b*, 258*c*, and 258*d* disposed in the third sub-pixel SP-R emitting blue light may be different from each other.

For example, in sub-pixels that respectively emit light of three colors of red, green, and blue, an amount of the Joule-heat JH-related current required in the first sub-pixel SP-R that emits red light is the largest, while an amount of Joule-heat JH-related current required in the third sub-pixel SP-B which emits blue light is the smallest. Thus, as the amount of Joule-heat JH-related current required in the third sub-pixel SP-B which emits blue light is the smallest, the second electrode 265 may be broken with a small amount of current.

Accordingly, each of the first to fourth pad contact-holes 258*a*, 258*b*, 258*c*, and 258*d* disposed in the first sub-pixel SP-R that emits red light may have the largest width, while each of the first to fourth pad contact-holes 258*a*, 258*b*, 258*c*, and 258*d* disposed in the third sub-pixel SP-B that emits blue light may have the smallest width.

In one example, in the second embodiment of the present disclosure, a configuration in which the first trench TR1 is disposed on the buffer insulating layer 207 so as to extend through the protective layer 229, the interlayer insulating film 219, and the gate insulating layer 213, and the reflective layer 233 and the first insulating layer 239 having a concave profile are sequentially disposed in the first trench TR1, and the first micro-LED 250*a* and the second micro-LED 250*b* are disposed on the first insulating layer 239 having the concave profile has been described. However, the present disclosure is not limited thereto. For example, each of the buffer insulating layer 207, the gate insulating layer 213, the interlayer insulating film 219, and the protective layer 229 may have a flat upper surface. Accordingly, the first insulating layer 239 may also have a flat upper surface. The first micro-LED 250*a* and the second micro-LED 250*b* may be disposed on the first insulating layer 239 having a flat surface.

Figure 10:
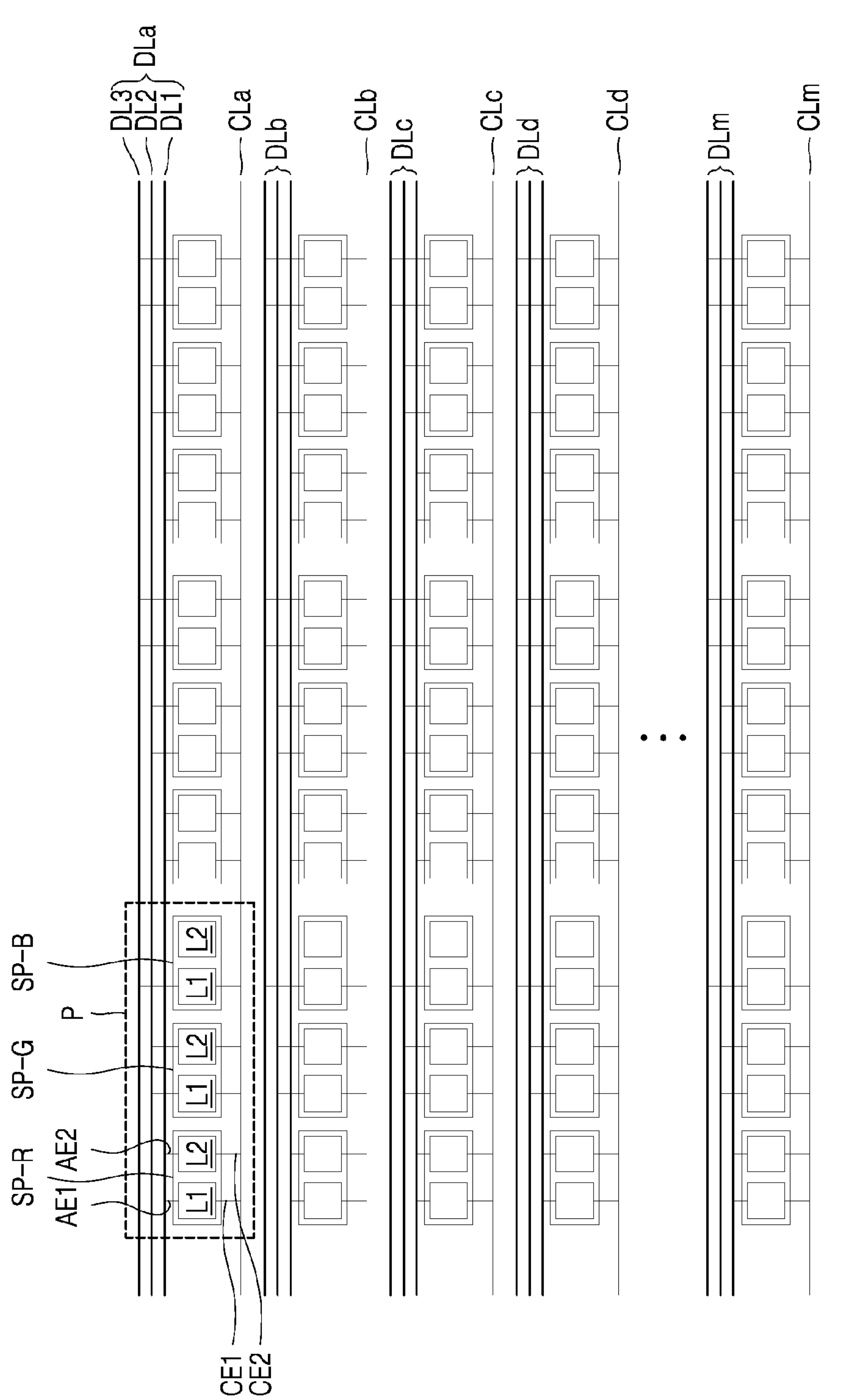
FIG. 10 is a diagram showing an array structure of a display device including a plurality of sub-pixels according to an embodiment of the present disclosure.

FIG. 10 is a diagram showing an array structure of a display device including a plurality of sub-pixels according to an embodiment of the present disclosure.

Referring to FIG. 10, the first micro-LED L1 and the second micro-LED L2 disposed in each of the plurality of sub-pixels SP-R, SP-G, and SP-B constituting the unit pixel P may be connected to each of a first data line DLa of a first row, a second data line DLb of a second row, a third data line DLc of a third row, a fourth data line DLd of a fourth row, and a m-th data line DLm of a m-th row via the respective anode electrode AE1 and AE2 (or the second electrodes). In this regard, each of the first data line DLa to m-th data line DLm includes a red data line DL1, a green data line DL2, and a blue data line DL3. However, the present disclosure is not limited thereto.

For example, in the first row, one red sub-pixel SP-R may be connected to one red data line DL1 via anode electrodes AE1 and AE2, one green sub-pixel SP-G may be connected to one green data line DL2 via anode electrodes AE1 and AE2, and one blue sub-pixel SP-B may be connected to one blue data line DL3 via anode electrodes AE1 and AE2.

Further, the first micro-LED L1 and the second micro-LED L2 may be connected to each of a first common voltage line CLa of the first row, a second common voltage line CLb of the second row, a third common voltage line CLc of the third row, a fourth common voltage line CLd of the fourth row, and an m-th common voltage line CLm of the m-th row via the respective cathode electrodes CE1 and CE2 (or the first electrodes). In this regard, m is a natural number.

The array structure of the display device including the aforementioned plurality of sub-pixels may vary based on a varying connection structure of the common voltage line. This will be described with reference to the drawings below.

Figure 11:
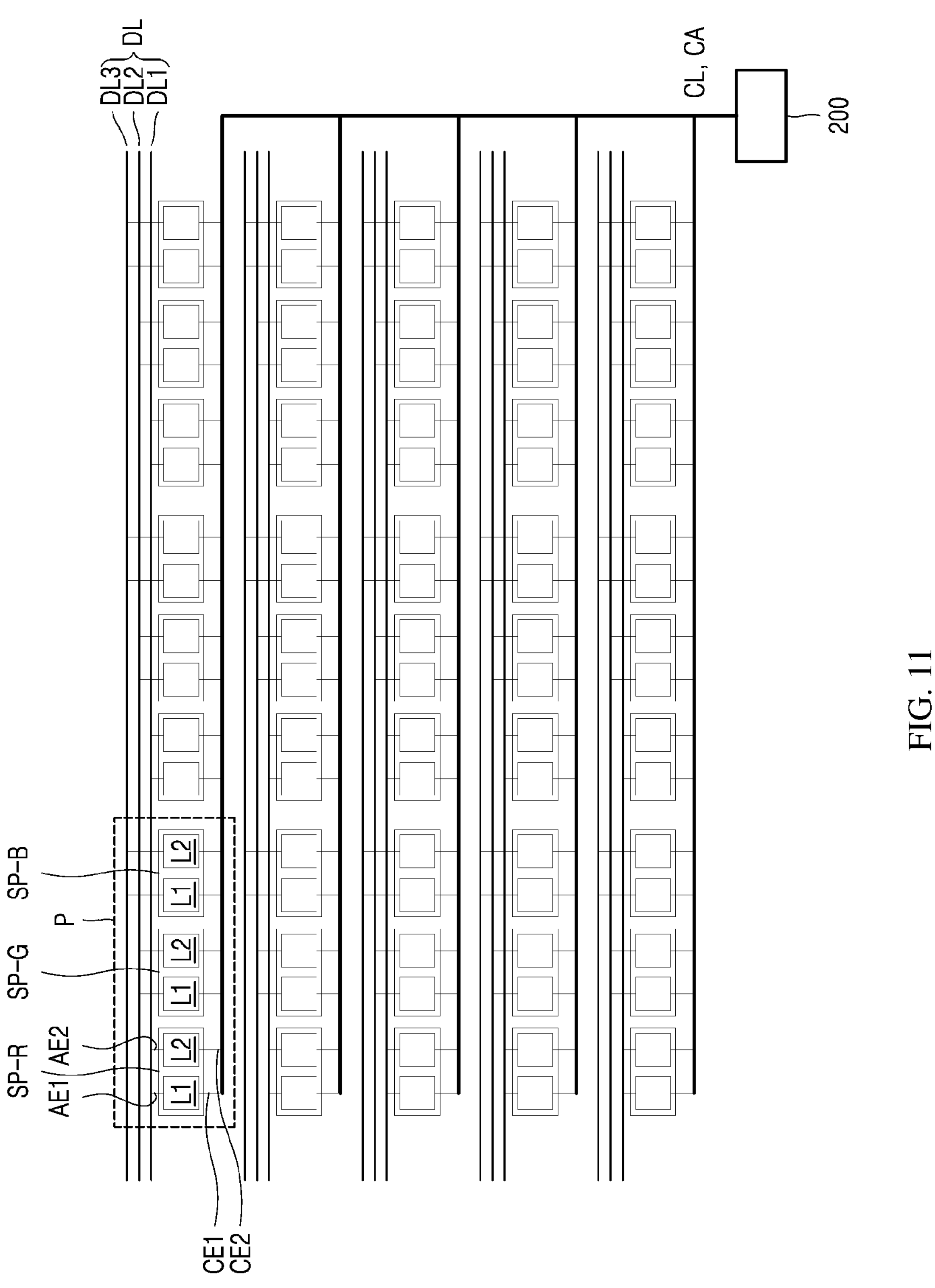
FIG. 11 is a diagram showing another array structure of a display device including a plurality of sub-pixels according to an embodiment of the present disclosure.

FIG. 11 is a diagram showing another array structure of a display device including a plurality of sub-pixels according to an embodiment of the present disclosure. Other components in FIG. 11 than the common voltage line are identical with those of the array structure in FIG. 10, and only a configuration of the common voltage line in FIG. 11 is different from that in FIG. 10. Thus, only the difference will be described.

Referring to FIG. 11, the common voltage line CL may be connected to the respective cathode electrodes CE1 and CE2 (or the first electrodes) of the first micro-LED L1 and the second micro-LED L2 disposed in each of the plurality of sub-pixels SP-R, SP-G, and SP-B. In this regard, a resistance increases as a distance from the common voltage supply 200 that supplies the common voltage increases. Thus, in a large-area display device, the common voltage may not be supplied to a sub-pixel at the farthest position from the common voltage supply 200. Accordingly, the common voltage line CL may further include an auxiliary electrode line CA overlapping with the common voltage line CL so as to lower the resistance and thus supply the common voltage to the sub-pixel. The auxiliary electrode line CA may be positioned under or above the common voltage line CL so as to overlap the common voltage line CL. In this regard, the data line DL1 may supply the data signal to each of the first micro-LED L1 and the second micro-LED L2 via each of the anode electrodes AE1 and AE2 (or the second electrodes).

FIG. 12A to FIG. 12D are drawings to illustrate a method for repairing the array structure of the display device in FIG. 11 according to an embodiment.

Figure 12A:
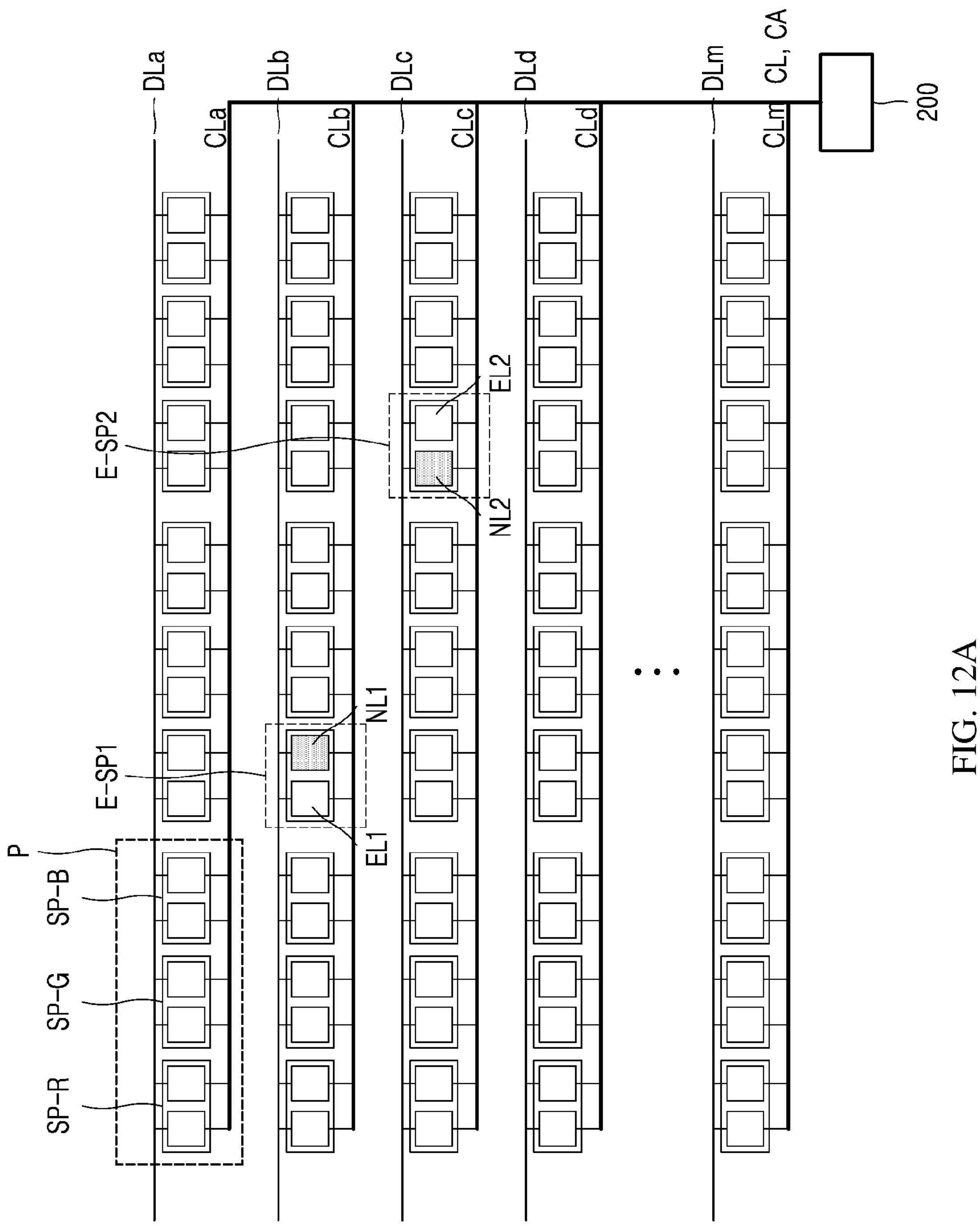
FIG. 12A to FIG. 12D are drawings for illustrating a method for repairing an array structure in the display device in FIG. 11 according to an embodiment of the present disclosure.

Referring to FIG. 12A, each of the plurality of sub-pixels is connected to each of the first data line DLa of the first row, the second data line DLb of the second row, the third data line DLc of the third row, the fourth data line DLd of the fourth row, and the m-th data line DLm of the m-th row extending horizontally via the anode electrode (or the second electrode). Further, each of the sub-pixels connected to each of the first data line DLa to the m-th data line DLm of the first row to m-th row is connected to each of to a first common voltage line CLa of the first row to a m-th common voltage line CLm of the m-th row via each cathode electrode (or each first electrode). In this regard, m is a natural number. The auxiliary electrode line CA may overlap the first common voltage line CLa to the m-th common voltage line CLm.

A defective light-emitting element EL1 or EL2 may occur in each of at least one sub-pixels E-SP1 and E-SP2 among the plurality of sub-pixels. For example, the defective light-emitting element EL1 or EL2 may occur in each of the sub-pixel E-SP1 positioned in the second row and the sub-pixel E-SP2 positioned in the third row.

In this case, the defective micro-LED EL1 or EL2 may be selectively excluded from among the first micro-LED EL1 or NL2 and the second micro-LED NL1 or EL2 disposed in each of the sub-pixels E-SP1 and E-SP2.

Figure 12B:
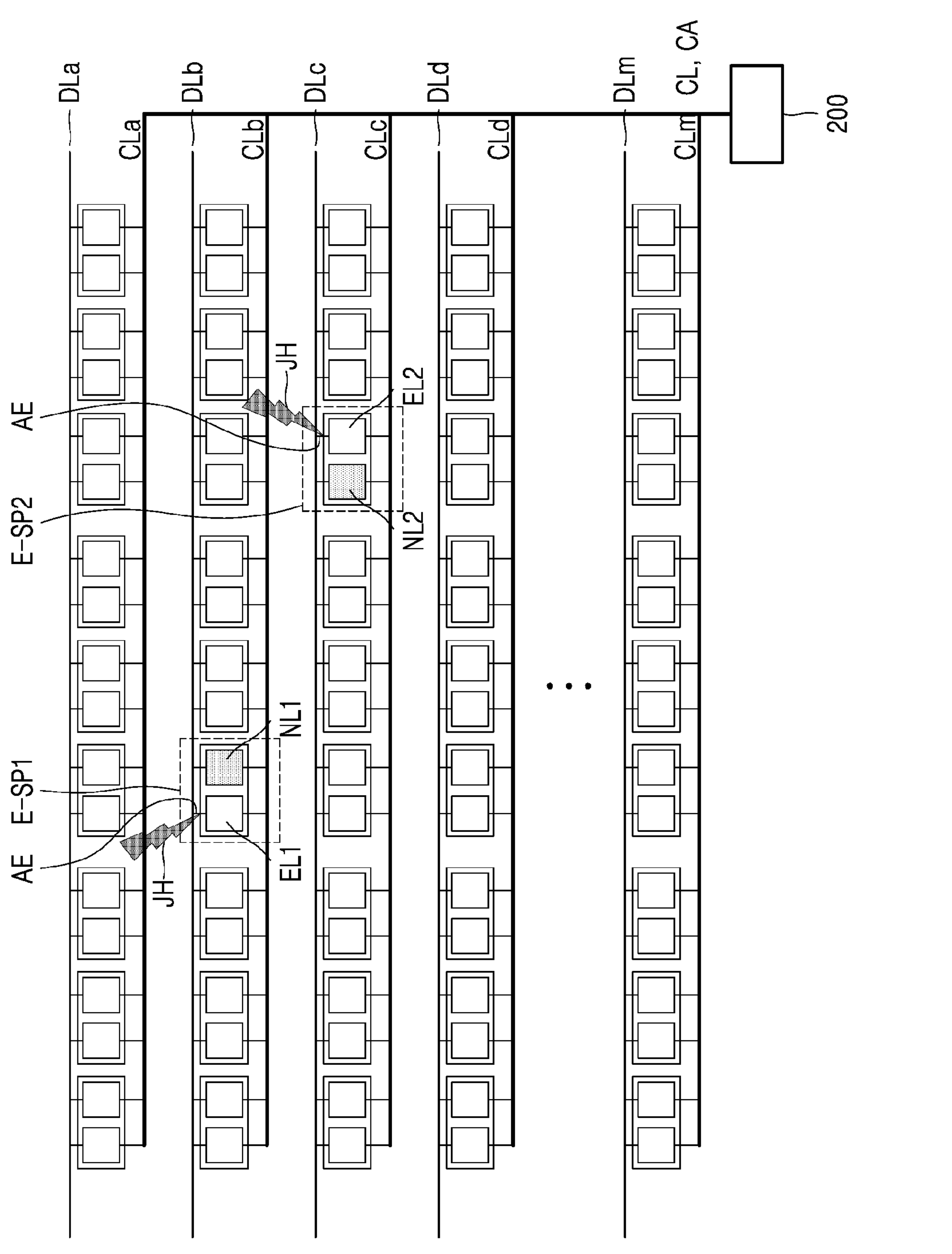
Figure 12C:
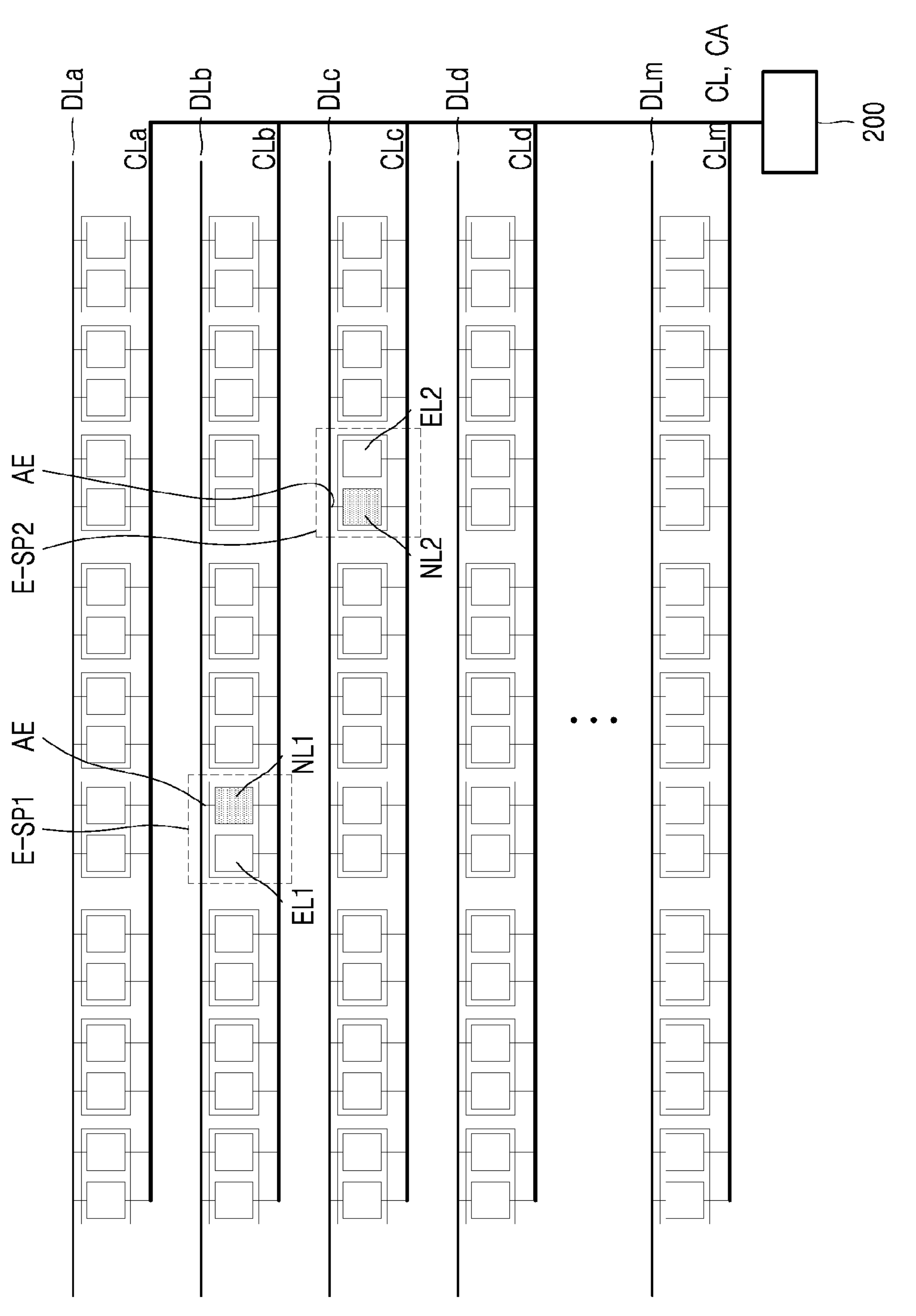

Referring to FIG. 12B, each of the first micro-LED EL1 of the sub-pixel E-SP1 positioned in the second row and the second micro-LED EL2 of the sub-pixel E-SP2 positioned in the third row may be a defective light-emitting element. In this case, a current with an amount of current that may generate the Joule-heat JH may be supplied to each of the first micro-LED EL1 of the second row and the second micro-LED EL2 of the third row where the defect has occurred. When the current with the amount of current that may generate the Joule-heat JH is supplied thereto, each of the anode electrodes (or the second electrodes) respectively connecting the first micro-LED EL1 of the second row and the second micro-LED EL2 of the third row where the defect has occurred to the data lines DLb and DLc may be broken, as shown in FIG. 12C.

Figure 12D:
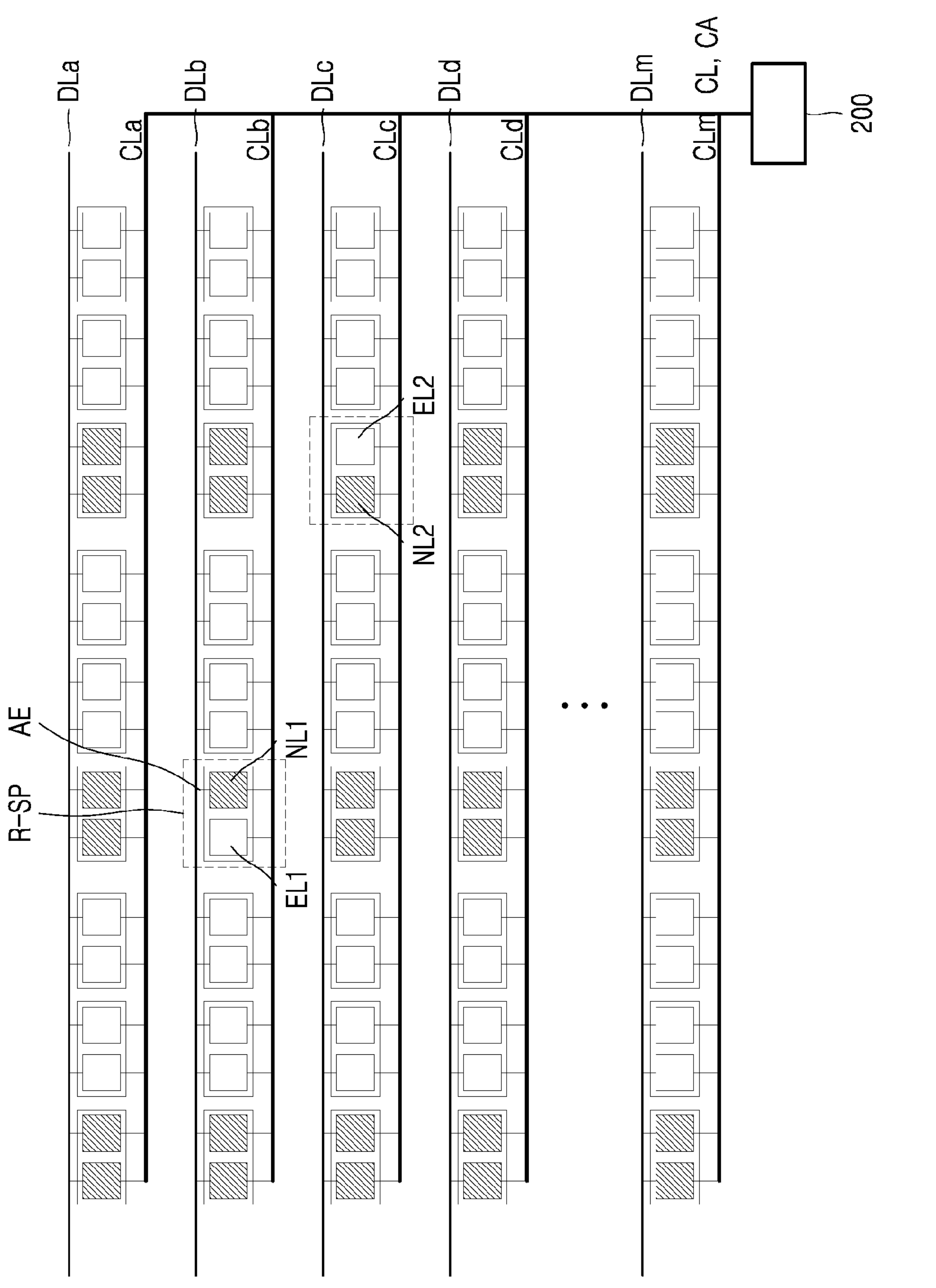

When an entirety of the display device operates, each of the first micro-LED EL1 in the second row and the second micro-LED EL2 in the third row is disconnected from the corresponding pixel and thus does not emit light. Thus, as shown in FIG. 12D, each of the first micro-LED NL1 of the second row and the second micro-LED NL2 of the third row as the normal light-emitting element is connected to each of the data lines DLb and DLc via a non-broken portion of the second electrode, and thus emits light at normal luminance while not acting as the dark spot.

In other words, even when a plurality of defective light-emitting elements occur at different positions, respectively, the display device may selectively exclude the defective light-emitting elements from the corresponding sub-pixels, thereby minimizing the time required for repairing the display device. Further, even when a plurality of defective light-emitting elements occur in different positions, respectively, a repairing process may be performed on the defective light-emitting elements simultaneously, instead of sequentially repairing the defective light-emitting elements.

Figure 13:
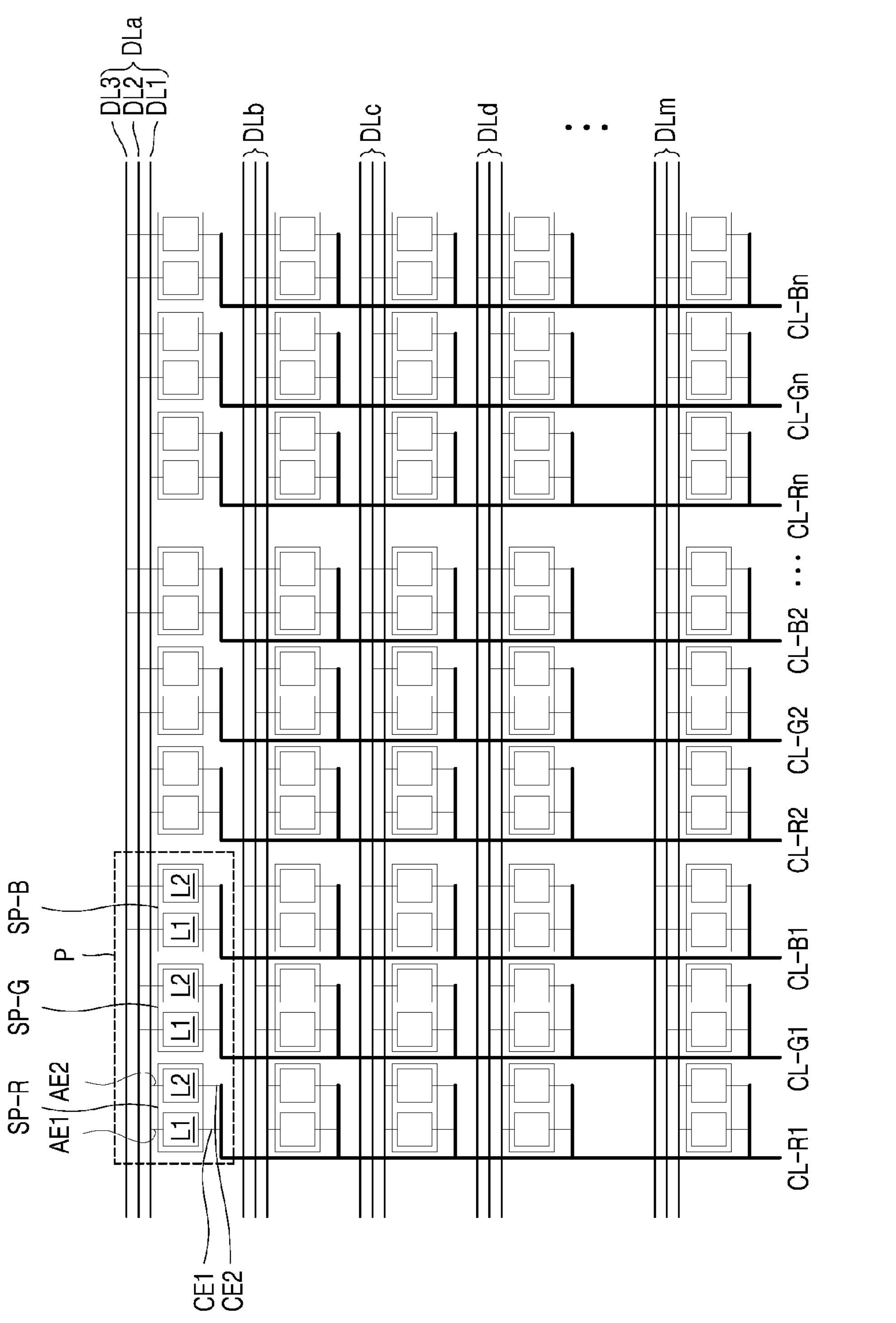
FIG. 13 is a diagram showing still another array structure of a display device including a plurality of sub-pixels according to an embodiment of the present disclosure.

FIG. 13 is a diagram showing still another array structure of a display device including a plurality of sub-pixels according to an embodiment of the present disclosure. Other components in FIG. 13 than the common voltage line are identical with those of the array structure in FIG. 10, and only a configuration of the common voltage line in FIG. 13 is different from that in FIG. 10. Thus, only the difference will be described.

Referring to FIG. 13, the first micro-LED L1 and the second micro-LED L2 disposed in each of the plurality of sub-pixels SP-R, SP-G, and SP-B constituting the unit pixel P may be connected to each of a first data line DLa of a first row, a second data line DLb of a second row, a third data line DLc of a third row, a fourth data line DLd of a fourth row, and a m-th data line DLm of a m-th row via the respective anode electrode AE1 and AE2 (or the second electrodes). In this regard, each of the first data line DLa to m-th data line DLm includes a red data line DL1, a green data line DL2, and a blue data line DL3. However, the present disclosure is not limited thereto.

Further, sub-pixels positioned in the same column extending in a vertical direction and emitting the same color of light may be connected to the same common voltage line. Specifically, the first and second micro-LEDs L1 and L2 positioned at the red sub-pixels SP-R of the first column extending in the vertical direction may be commonly connected to a first red common voltage line CL-R1 via the respective cathode electrodes CE1 and CE2 (or the first electrodes). Further, the first and second micro-LEDs L1 and L2 positioned at the green sub-pixels SP-G of the second column extending in the vertical direction may be commonly connected to a first green common voltage line CL-G1 via the respective cathode electrodes CE1 and CE2 (or the first electrodes). Further, the first and second micro-LEDs L1 and L2 positioned at the blue sub-pixels SP-B of the third column extending in the vertical direction may be commonly connected to a first blue common voltage line CL-B1 via the respective cathode electrodes CE1 and CE2 (or the first electrodes).

The first and second micro-LEDs positioned in each of the red, green, and blue sub-pixels in an n-th column may be connected to each of n-th common voltage lines CL-Rn, CL-Gn, and CL-Bn via the respective cathode electrodes CE1 and CE2 (or the first electrodes). In this regard, each of m and n is a natural number.

In this way, when the sub-pixels positioned in the same column extending in the vertical direction, and emitting light of the same color are connected to the same common voltage line, repairing accuracy of the defective light-emitting element may be further improved. For example, when a defect occurs in the first micro-LED L1 of the red sub-pixel SP-R in the first row, the current with a current amount that can generate the Joule-heat JH may be supplied to the first anode electrode AE1 connected to the first data line DLa of the first row or the first cathode electrode CE1 connected to the first common voltage line CL-R1 in the first column so as to be broken. Thus, the repairing accuracy may be further improved.

Figure 14:
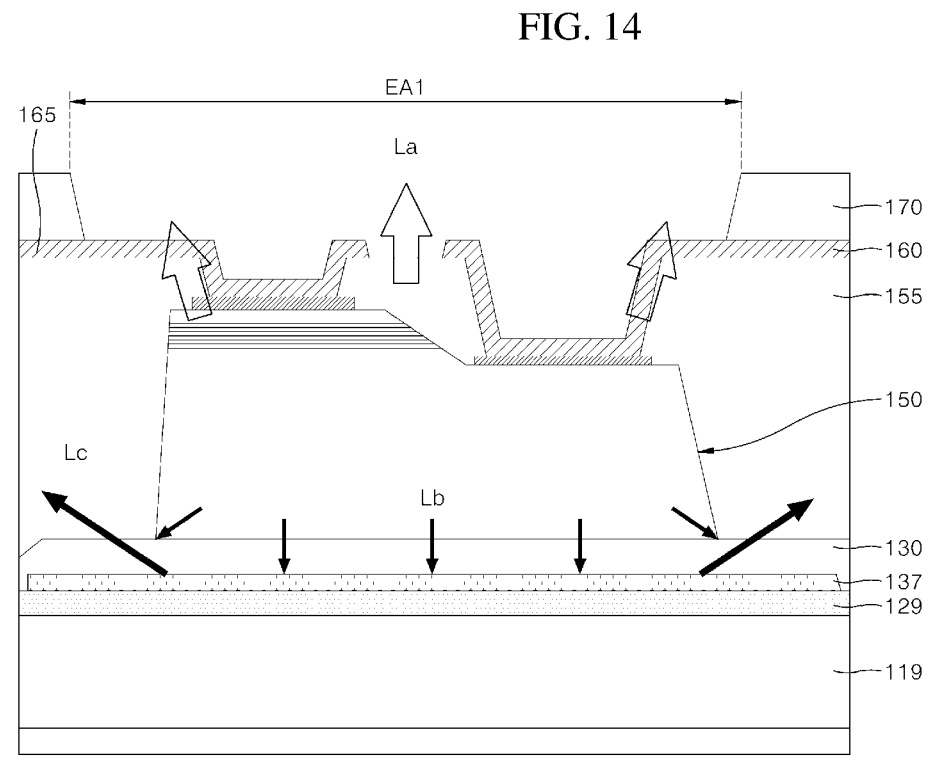
Figure 15:
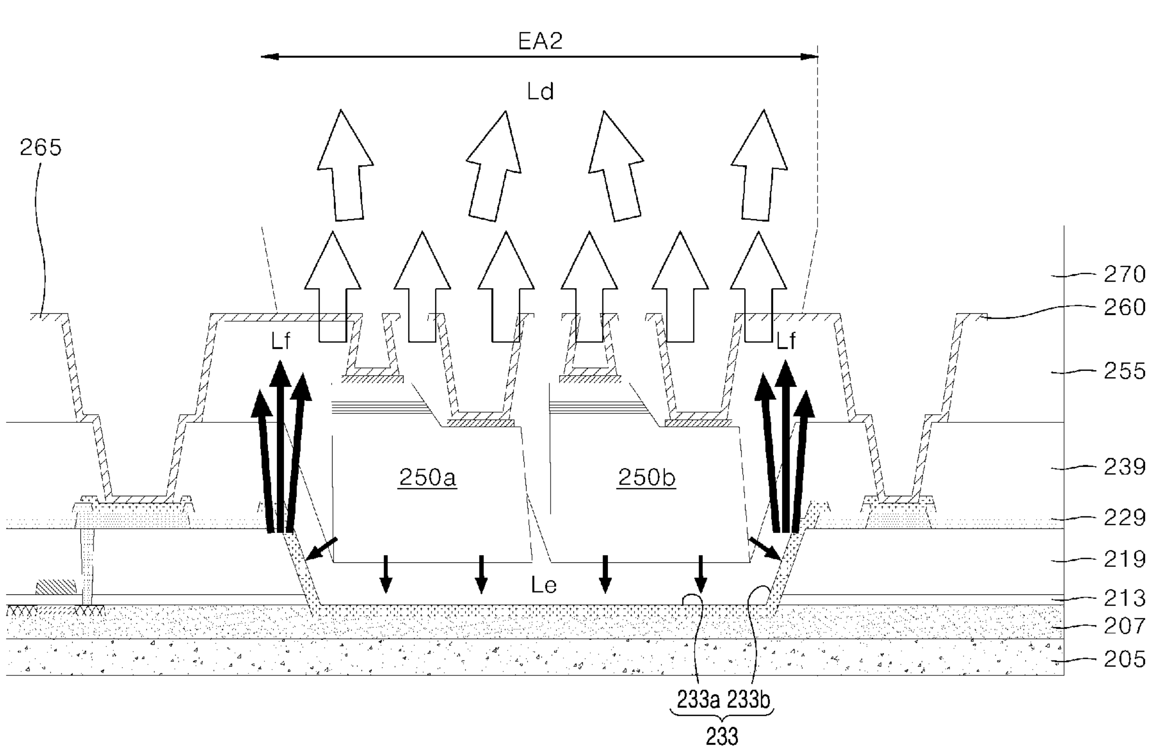

FIG. 14 and FIG. 15 are diagrams for illustrating the light-emitting efficiency of the display device according to each of the first embodiment and the second embodiment of the present disclosure.

Referring to FIG. 14, regarding the micro-LED 150 according to the first embodiment of the present disclosure, a portion La of the light emitted from the active layer 143 (see FIG. 3) is emitted toward the light-emitting area EA1, while a portion Lb of the light emitted toward the plate-shaped reflective layer 137 located under the first semiconductor layer 140 (see FIG. 3) is reflected therefrom and then is emitted toward the light-emitting area EA1, while a portion Lc of the reflected light is emitted toward the third insulating layer 155 rather than toward the light-emitting area EA1. Thus, sufficient light extraction efficiency may not be secured.

However, referring to FIG. 15, the reflective layer 233 has the concave profile. That is, the reflective layer 233 includes the bottom portion 233*a* disposed on the substrate and extending horizontally, and the sidewall portion 233*b* upwardly extending from the bottom portion and extending through the interlayer insulating film in an inclined manner. The micro-LEDs 250*a* and 250*b* according to the second embodiment of the present disclosure are disposed on the reflective layer 233. A position of each of the micro-LEDs 250*a* and 250*b* may vertically overlap the bottom portion 233*a* of the reflective layer 233. Accordingly, a portion Ld of the light emitted from the active layers 243*a* and 243*b* (refer to FIG. 5) is emitted toward the light-emitting area EA1, while a portion Le of the light emitted toward the reflective layer 233 is reflected from the bottom portion 233*a* of the reflective layer 233 and is then emitted toward the light-emitting area EA2, while a portion Lf of the light emitted toward the reflective layer 233 is reflected from both opposing sidewall portions 233*b* of the reflective layer 233, and is then emitted toward the light-emitting area EA2, thereby improving light extraction efficiency. In other words, light extraction efficiency may be improved by preventing a portion of the light from leaking in a lateral direction.

According to an embodiment of the present disclosure, when the defective micro-LED occurs after transferring the plurality of micro-LEDs, the defective micro-LED in the sub-pixel in which the defective micro-LED has occurred may be selectively excluded therefrom, so that the sub-pixel in which the defect has occurred may be repaired to a normal sub-pixel.

Further, even when a plurality of defective light-emitting elements occur in different positions of the display device, the display device may selectively exclude the defective light-emitting elements from the corresponding sub-pixels, thereby minimizing the time required for repairing. In addition, even when a plurality of defective light-emitting elements occur at different positions, the repairing process may be simultaneously performed on the plurality of defective light-emitting elements.

Although the embodiments of the present disclosure have been described in more detail with reference to the accompanying drawings, the present disclosure is not necessarily limited to these embodiments. Various modifications may be made without departing from the technical idea of the present disclosure. Therefore, the embodiments disclosed in the present disclosure are not intended to limit the technical idea of the present disclosure, but to illustrate the same. The scope of the technical idea of the present disclosure is not limited to these embodiments. Therefore, it should be understood that the embodiments as described above are not restrictive but illustrative in all respects.

What is claimed is:

1. A display device comprising:

a substrate;

a plurality of sub-pixels on the substrate; and a data line and a common voltage line disposed on each of the plurality of sub-pixels, wherein at least one of the plurality of sub-pixels comprises:

a thin-film transistor;

a first light-emitting element;

a second light-emitting element, wherein the second light-emitting element and the first light-emitting element are adjacent to each other and spaced from each other;

a first electrode connecting the first light-emitting element and the second light-emitting element to the common voltage line;

a second electrode connecting the first light-emitting element and the second light-emitting element to a drain electrode of the thin-film transistor, wherein the drain electrode is connected to the data line; and a reflective layer having a concave profile, wherein the first light-emitting element and the second light-emitting element are on the reflective layer.

2. The display device of claim 1, further comprising:

an auxiliary electrode line overlapping with the common voltage line.

3. The display device of claim 1, wherein the second electrode is connected in series or in parallel with the first light-emitting element and the second light-emitting element.

4. The display device of claim 1, wherein responsive to one of the first light-emitting element and the second light-emitting element included in each of the plurality of sub-pixels is defective, the display device is configured to supply a current having a current amount that generates Joule-heat to the second electrode supplying the current to the defective light-emitting element so as to break a portion of the second electrode connected to the defective light-emitting element, such that the other of the first light-emitting element and the second light-emitting element acts as a normal light-emitting element and is electrically connected to the data line via a non-broken portion of the second electrode.

5. The display device of claim 1, wherein the common voltage line is connected to each of the plurality of sub-pixels emitting light of a same color.

6. A display device comprising:

a substrate;

a thin-film transistor on the substrate;

an interlayer insulating film on the thin-film transistor;

a reflective layer extending through the interlayer insulating film;

a first insulating layer on the reflective layer;

a first light-emitting element on the first insulating layer and in an area overlapping the reflective layer, the first light-emitting element including a first pad electrode and a second pad electrode;

a second light-emitting element adjacent to and spaced from the first light-emitting element, on the first insulating layer, and in the area overlapping the reflective layer, the second light-emitting element including a first pad electrode and a second pad electrode;

a first electrode connected to each of the first pad electrode of the first light-emitting element and the first pad electrode of the second light-emitting element, the first electrode extending through the first insulating layer so as to be connected to a common voltage line; and a second electrode connected to each of the second pad electrode of the first light-emitting element and the second pad electrode of the second light-emitting element, the second electrode extending through the first insulating layer so as to be connected to the thin-film transistor.

7. The display device of claim 6, wherein each of the first light-emitting element and the second light-emitting element includes a first semiconductor layer, an active layer on a first side of an upper surface of the first semiconductor layer, and a second semiconductor layer on the active layer, wherein the first pad electrode is disposed on a second side of the upper surface of the first semiconductor layer, wherein the second pad electrode is on the second semiconductor layer.

8. The display device of claim 6, wherein the first light-emitting element and the second light-emitting element are positioned at a same vertical level.

9. The display device of claim 6, further comprising:

a second insulating layer on the first insulating layer, the second insulating layer including:

a first pad contact-hole defined therein exposing the second pad electrode of the first light-emitting element; and a second pad contact-hole defined therein exposing the second pad electrode of the second light-emitting element.

10. The display device of claim 9, wherein a portion of the second insulating layer positioned between the first pad contact-hole and the second pad contact-hole has a reverse tapered shape in a cross-sectional view of the display device, wherein each of the first pad contact-hole and the second pad contact-hole has a tapered shape in the cross-sectional view of the display device in which a top is narrower than a bottom.

11. The display device of claim 9, wherein a portion of the second electrode on and extending along a side surface of each of the first pad contact-hole and the second pad contact-hole has a thickness smaller than a thickness of each of a portion of the second electrode disposed on a top face of the second insulating layer and a portion of the second electrode disposed on and along a bottom of each of the first pad contact-hole and the second pad contact-hole.

12. The display device of claim 9, further comprising:

a conductive organic material layer on and extending along a side surface and a bottom of each of the first pad contact-hole and the second pad contact-hole, wherein a portion of the second electrode is on the conductive organic material layer.

13. The display device of claim 12, wherein a portion of the conductive organic material layer on and extending along the side surface of each of the first pad contact-hole and the second pad contact-hole has a thickness smaller than a thickness of a portion of the conductive organic material layer disposed on a top face of the second insulating layer or a thickness of a portion of the conductive organic material layer on and extending along the bottom of each of the first pad contact-hole and the second pad contact-hole.

14. The display device of claim 6, further comprising:

a second insulating layer on the first insulating layer, the second insulating layer including:

a first pad contact-hole defined therein exposing the second pad electrode of the first light-emitting element; and a second pad contact-hole defined therein exposing the second pad electrode of the second light-emitting element; and a conductive organic material layer on and extending along an exposed surface of each of the first pad contact-hole and the second pad contact-hole, and on and extending along a portion of a top face of the second insulating layer, wherein the conductive organic material layer is in contact with a portion of the second electrode disposed on the top face of the second insulating layer.

15. The display device of claim 6, wherein the reflective layer includes:

a bottom portion on the substrate and extending horizontally; and a sidewall portion upwardly extending from the bottom portion and extending through the interlayer insulating film in an inclined manner.

16. The display device of claim 15, wherein a position of each of the first light-emitting element and the second light-emitting element vertically overlaps the bottom portion of the reflective layer.

17. The display device of claim 9, wherein the first insulating layer includes a positive type photoactive compound, and the second insulating layer includes a negative type photoactive compound.

18. The display device of claim 6, further comprising:

a first connection electrode on the interlayer insulating film to be connected to an upper surface of a drain electrode of the thin-film transistor.

19. The display device of claim 18, further comprising:

a first conductive pad on an upper surface of the common voltage line to be connected to the common voltage line and a second conductive pad disposed on an upper surface of the first connection electrode to be connected to the first connection electrode.

20. The display device of claim 19, further comprising:

a first trench extending through the interlayer insulating film, wherein the reflective layer is on an inner surface of the first trench.

21. The display device of claim 20, wherein the first conductive pad, the second conductive pad, and the reflective layer are positioned in a same layer and are made of a same material.

22. The display device of claim 20, wherein the reflective layer is along a profile of the first trench and has a concave profile.

23. The display device of claim 20, further comprising:

a second trench defined in the first insulating layer, wherein the second trench has a bottom surface positioned at a vertical level lower than that of an upper surface of the interlayer insulating film.

24. The display device of claim 14, wherein a side face of the first pad contact-hole is covered with a double layer structure of the conductive organic material layer and the second electrode.

25. A repairing method in a display device, wherein the display device includes:

a substrate;

a plurality of sub-pixels formed on the substrate; and a data line and a common voltage line disposed on each of the plurality of sub-pixels, wherein at least one of the plurality of sub-pixels comprises:

a thin-film transistor;

a first light-emitting element;

a second light-emitting element, wherein the second light-emitting element and the first light-emitting element are adjacent to each other and spaced from each other;

a first electrode connecting the first light-emitting element and the second light-emitting element to the common voltage line; and a second electrode connecting the first light-emitting element and the second light-emitting element to a drain electrode of the thin-film transistor, wherein the drain electrode is connected to the data line, wherein the repairing method comprises:

responsive to one of the first light-emitting element and the second light-emitting element included in a sub-pixel among the plurality of sub-pixels is a defective light-emitting element, supplying a current having a current amount that generates Joule-heat to the second electrode of the defective light-emitting element so as to break a portion of the second electrode connected to the defective light-emitting element, such that the other of the first light-emitting element and the second light-emitting element acts as a normal light-emitting element and is electrically connected to the data line via a non-broken portion of the second electrode.

* * * * *